US009101029B2

(12) United States Patent
Shamoto et al.

(10) Patent No.: US 9,101,029 B2
(45) Date of Patent: Aug. 4, 2015

(54) LED LIGHT-EMITTING DEVICE AND INDICATOR PROVIDED WITH THE LED LIGHT EMITTING DEVICE

(71) Applicant: MITSUBISHI CHEMICAL CORPORATION, Chiyoda-ku (JP)

(72) Inventors: Takeshi Shamoto, Chiyoda-ku (JP); Akeo Kasaukura, Chiyoda-ku (JP); Toru Takeda, Chiyoda-ku (JP)

(73) Assignee: Mitsubishi Chemical Corporation, Chiyoda-ku (JP)

( * ) Notice: Subject to any disclaimer, the term of this patent is extended or adjusted under 35 U.S.C. 154(b) by 200 days.

(21) Appl. No.: 13/770,431

(22) Filed: Feb. 19, 2013

(65) Prior Publication Data

US 2013/0162140 A1 Jun. 27, 2013

Related U.S. Application Data

(63) Continuation of application No. PCT/JP2011/068395, filed on Aug. 11, 2011.

(30) Foreign Application Priority Data

Aug. 18, 2010 (JP) ................................. 2010-183138

(51) Int. Cl.
*H01J 1/62* (2006.01)
*H05B 33/08* (2006.01)
(Continued)

(52) U.S. Cl.
CPC ............ *H05B 33/0872* (2013.01); *B60Q 3/001* (2013.01); *G01D 11/28* (2013.01);
(Continued)

(58) Field of Classification Search
CPC .... G01D 11/28; H01L 25/0753; H01L 33/50; F21Y 2113/005; F21Y 9/00; H05B 37/02; H05B 33/0803; H05B 33/0857; B60Q 3/0293

USPC ................. 313/498, 501–503; 362/230, 231, 362/249.02; 257/13, 79, 100; 315/291, 294, 315/307, 302, 312

See application file for complete search history.

(56) References Cited

U.S. PATENT DOCUMENTS 5,815,072 A 9/1998 Yamanaka et al.
7,821,194 B2 * 10/2010 Negley et al. ................. 313/498
(Continued)

FOREIGN PATENT DOCUMENTS

JP 10-26541 1/1998
JP 10-26542 1/1998
(Continued)

OTHER PUBLICATIONS

U.S. Appl. No. 13/781,948, filed Mar. 1, 2013, Kasakura, et al.
(Continued)

*Primary Examiner* — Haiss Philogene
(74) *Attorney, Agent, or Firm* — Oblon, Spivak, McClelland, Maier & Neustadt, L.L.P.

(57) ABSTRACT

A first LED emits visible light of an emission color such that with respect to a CIE(1976)L*u*v* color space chromaticity diagram, the chromaticity is exterior to a prescribed white light region wherein the absolute value of a deviation duv from the blackbody radiation locus is at most 0.02 and the color temperature is within a range of from 2,500K to 10,000K, and the deviation duv from the blackbody radiation locus is larger than 0.02, and a second LED emits visible light of an emission color such that with respect to the above chromaticity diagram, the chromaticity is exterior to the prescribed white light region, and the deviation duv from the blackbody radiation locus is smaller than −0.02.

19 Claims, 10 Drawing Sheets

(51) Int. Cl.
*B60Q 3/00* (2006.01)
*G01D 11/28* (2006.01)
*H01L 25/075* (2006.01)
*F21Y 113/00* (2006.01)
*H01L 33/50* (2010.01)
*H01L 33/60* (2010.01)

(52) U.S. Cl.
CPC ........ *H01L25/0753* (2013.01); *H05B 33/0803* (2013.01); *H05B 33/0857* (2013.01); *F21Y 2113/005* (2013.01); *H01L 33/50* (2013.01); *H01L 33/60* (2013.01); *H01L 2224/48091* (2013.01); *H01L 2224/73265* (2013.01); *H01L 2924/0002* (2013.01); *H01L 2924/09701* (2013.01)

(56) References Cited

U.S. PATENT DOCUMENTS

| | | | |
|---|---|---|---|
| 8,212,466 B2 * | 7/2012 | Negley et al. | 313/498 |
| 8,598,565 B2 * | 12/2013 | Brandes | 257/13 |
| 8,698,388 B2 * | 4/2014 | Cash | 313/501 |
| 2007/0222360 A1 | 9/2007 | Kaneda et al. | |
| 2008/0303410 A1 | 12/2008 | Kaneda et al. | |
| 2009/0267484 A1 | 10/2009 | Kasakura et al. | |
| 2010/0141172 A1 | 6/2010 | Uchida et al. | |
| 2010/0156959 A1 | 6/2010 | Tanahashi et al. | |
| 2010/0171440 A1 | 7/2010 | Satou et al. | |
| 2010/0207134 A1 | 8/2010 | Tanaka et al. | |
| 2010/0213861 A1 | 8/2010 | Kaneda et al. | |
| 2010/0295464 A1 | 11/2010 | Kasakura et al. | |
| 2011/0278606 A1 | 11/2011 | Suzuki et al. | |

FOREIGN PATENT DOCUMENTS

| | | |
|---|---|---|
| JP | 2001-281001 | 10/2001 |
| JP | 2003-165355 | 6/2003 |
| JP | 2006-4839 | 1/2006 |
| JP | 2006-148051 | 6/2006 |
| JP | 2007-122950 | 5/2007 |
| JP | 2007-227678 | 9/2007 |
| JP | 2007-227680 | 9/2007 |
| JP | 2007-256194 | 10/2007 |
| JP | 2009-231525 | 10/2009 |
| JP | 2009-238729 | 10/2009 |
| JP | 4549438 | 7/2010 |
| WO | 2009/157999 | 12/2009 |

OTHER PUBLICATIONS

International Search Report issued Nov. 8, 2011, in PCT/JP2011/068395 filed Aug. 11, 2011.

Official Action received in corresponding JP Application No. 2011-172885, dated Sep. 10, 2014 (with English translation).

* cited by examiner

LED LIGHT-EMITTING DEVICE AND INDICATOR PROVIDED WITH THE LED LIGHT EMITTING DEVICE

TECHNICAL FIELD

The present invention relates to an LED light emitting device employing LEDs, and an indicator employing light emitted from such an LED light emitting device to carry out an indication.

BACKGROUND ART

LED light emitting devices employing LEDs have been widely used as light sources for various illumination and display devices. Further, an LED light emitting device has also been developed and used, wherein plural types of LEDs that emit different colors from semiconductor light emitting elements such as LED chips, are used in combination so that the respective emission colors are combined to obtain a desired radiation color. For example, Patent Document 1 discloses an LED light emitting device wherein three types of LEDs that emit e.g. blue light, green light and red light, are used in combination, and drive currents to be supplied to the respective LEDs are adjusted, so that the lights emitted from the respective LEDs are combined to obtain a desired white light.

In nature, a semiconductor light emitting element itself has a relatively narrow emission spectrum width, and if light emitted from such a semiconductor light emitting element itself is used for illumination as it is, there may be a problem that color rendering properties which become important in usual illumination, tend to be low. Therefore, in order to solve such a problem, LED has been developed wherein light emitted from a semiconductor light emitting element is subjected to wavelength conversion by means of a wavelength conversion member such as a phosphor, followed by emission, and an LED light emitting device wherein such LEDs are used in combination, is disclosed in e.g. Patent Document 2. In the LED light emitting device in Patent Document 2, blue LED employing a semiconductor light emitting element to emit blue light, green LED having combined to the blue light emitting element a green phosphor to be excited by the blue light emitted from the blue light emitting element, to emit green light, and red LED having combined to the blue light emitting element a red phosphor to be excited by the blue light emitted from the blue light emitting element, to emit red light, are used. And, by combining lights emitted respectively from these blue, green and red LEDs, it is possible to secure excellent color rendering properties, and by adjusting the light outputs of the respective LEDs, it is possible to variously change the radiation color of the LED light emitting device.

Thus, it is possible to variously change the radiation color of the LED light emitting device by using plural types of LEDs that are different in emission color, and accordingly, various proposals have been made to apply the LED light emitting device to an indicator to carry out an indication by the change of the radiation color. For example, Patent Document 3 proposes a combination meter for a vehicle, in which the LED light emitting device is applied for illumination. That is, in the combination meter in Patent Document 3, white LED to emit white light and orange LED to emit orange light are used for transmissive illumination of a dial face, and it is so designed that the position of illumination by orange light is changed in accordance with the movement of an indicating needle, by illuminating a site of the dial face corresponding to the position of the indicating needle, with orange light and at the same time, illuminating other sites of the dial face with white light.

Further, Patent Document 4 proposes a meter device for a vehicle, wherein an LED light emitting device comprising red LED to emit red light and green LED to emit green light, is used for illumination. The meter device in Patent Document 4 is designed so that illumination is carried out by green light until the travelling speed of the vehicle, the engine rotation speed or the like exceeds the upper limit value, and when it has exceeded the upper limit value, the illumination is switched to illumination by red light. Further, Patent Document 4 proposes to combine yellow LED to emit yellow light, in addition to the red and green LEDs.

These Patent Documents 3 and 4 are to increase the visibility of an indicator by switching between emissions of light from two types of LEDs having different emission colors. Patent Document 5 proposes a digital speed meter device for a vehicle, which is designed to variously change the indication color by combining emission colors by means of plural types of LEDs having different emission colors. In the meter device in Patent Document 5, an LED device is used which comprises red LED to emit red light, green LED to emit green light and blue LED to emit blue light, and it is designed to change the illumination color in the order of white, green, blue, yellow, orange and red as the traveling speed of the vehicle increases, by using lights emitted from these LEDs alone or in combination. Further, in Patent Document 5, it is also proposed to provide an auxiliary indication region to be used in combination with such a meter device, and it is designed to change the illumination color of the auxiliary indication region in the order of green, yellow and red as the travelling speed of the vehicle increases, by means of an LED light emitting device comprising red LED and green LED.

PRIOR ART DOCUMENTS

Patent Documents

Patent Document 1: JP-A-2006-4839
Patent Document 2: JP-A-2007-122950
Patent Document 3: JP-A-2007-256194
Patent Document 4: JP-A-2001-281001
Patent Document 5: JP-A-10-26542

DISCLOSURE OF INVENTION

Technical Problem

The LED devices as disclosed in Patent Documents 3 and 4, are intended, as the main object, to make it possible to distinctly indicate such a case where the travelling speed, the engine rotation speed or the like exceeds an acceptable value. Accordingly, no attention is paid to increase distinguishability of an intermediate region other than the upper or lower limit region. Therefore, for example, in a case where such a device is applied to an indicator of an operation member to carry out various settings such as temperature setting, air volume setting, etc. of an air conditioner, there are many opportunities to use an intermediate region, and in such a case, there is a problem such that it is difficult to distinguish the intermediate region. Further, as shown in Patent Documents 3 to 5, also in a meter device for a vehicle, the region that is practically used is an intermediate region, and distinguishability of such an intermediate region cannot be regarded as good. Therefore, in consideration of application to indicators, etc., an LED light emitting device is desired, which makes it possible to realize a distinct change in emission color over the entire region within a changeable range of emission color and at the same time to obtain a highly distinguishable emission color also in an intermediate region within the changeable range of emission color.

The present invention has been made under such a circumstance, and it is an object of the present invention to provide an LED light emitting device which makes it possible to realize a distinct change in emission color over the entire region within a changeable range of emission color and at the same time to obtain a highly distinguishable emission color also in an intermediate region within the changeable range of emission color.

Solution to Problem

In order to accomplish the above object, the LED light emitting device of the present invention is an LED light emitting device which radiates a combined light obtained by combining visible light emitted from first LED and visible light emitted from second LED and which comprises a drive controller unit that respectively controls a first drive current to be supplied to the first LED and a second drive current to be supplied to the second LED, wherein the first LED emits visible light of an emission color such that with respect to a CIE (1976) L*u*v* color space chromaticity diagram, the chromaticity is exterior to a prescribed white light region wherein the absolute value of a deviation duv from the blackbody radiation locus is at most 0.02 and the color temperature is within a range of from 2,500 K to 10,000 K, and the deviation duv from the blackbody radiation locus is larger than 0.02, and the second LED emits visible light of an emission color such that with respect to the CIE (1976) L*u*v* color space chromaticity diagram, the chromaticity is exterior to the prescribed white light region, and the deviation duv from the blackbody radiation locus is smaller than −0.02.

According to the LED light emitting device having the above construction, the drive controller unit controls the first drive current to be supplied to the first LED and the second drive current to be supplied to the second LED, respectively, whereby the chromaticity of a combined light obtainable by variously changing the ratio of the respective visible lights, changes variously within the changeable range of chromaticity from the chromaticity of only the visible light emitted from the first LED via the chromaticity of a combined light of visible lights emitted respectively from the first and second LEDs to the chromaticity of only the visible light emitted from the second LED.

At that time, the chromaticity of the visible light emitted from the first LED is such that the deviation duv from the blackbody radiation locus is larger than 0.02 in the CIE (1976) L*u*v* color space chromaticity diagram, while the chromaticity of the visible light emitted from the second LED is such that the deviation duv from the blackbody radiation locus is smaller than −0.02 in the CIE (1976) L*u*v* color space chromaticity diagram, whereby the color difference between the upper limit and the lower limit in the changeable range of chromaticity becomes larger than 0.04. Further, as the chromaticity of the visible light emitted from the first LED and the chromaticity of the visible light emitted from the second LED are set as described above, in the CIE (1976) L*u*v* color space chromaticity diagram, the blackbody radiation locus is present between the chromaticity point of the visible light emitted from the first LED and the chromaticity point of the visible light emitted from the second LED, and yet, both chromaticity points are exterior to the prescribed white light region. Therefore, in the course wherein the chromaticity of a combined light variously changes as described above, in an intermediate region within the changeable range of chromaticity, a white light is obtainable as the combined light, of which the absolute value of a deviation duv from the blackbody radiation locus is at most 0.02 in the CIE (1931) XYZ color space chromaticity diagram and the color temperature is within a range of from 2,500 K to 10,000 K.

Specifically, such a drive controller unit of the LED light emitting device may be designed to control the first and second drive currents so that the chromaticity of the combined light moves on a line that connects the chromaticity of the emission color of the first LED and the chromaticity of the emission color of the second LED.

More specifically, it is preferred that the line that connects the chromaticity of the emission color of the first LED and the chromaticity of the emission color of the second LED, passes through a chromaticity point at which X is at least 0.32 and at most 0.34, and Y is at least 0.32 and at most 0.34, in the CIE (1931) XYZ color space.

In the above LED light emitting device, it is preferred that the emission colors of the first and second LEDs are in a complementary color relation to each other. Here, "in a complementary color relation to each other" means that they are in a point symmetrical relation about the 0 point in the CIE 1976 (L*a*b*) color space, but is not limited to a strict point symmetrical relation. Specifically, in a case where on the a*b* coordinate plane represented by the CIE 1976 (L*a*b*) color space, a color phase is represented by an angle $\theta_a^*$ of a line segment OC connecting the 0 point (a*=0, b*=0) and color point C, from the a* axis, it is preferred that a difference between the respective angles $\theta_a^*$ of color points of the two emission colors is at least 120° and at most 240°. That is, the emission color of the first LED and the emission color of the second LED are preferably characterized in that on the a*b* coordinate plane in the CIE (1976) L*a*b* color space chromaticity diagram, the angle between a line segment that connects the origin and coordinates representing the emission color of the first LED and a line segment that connects the origin and coordinates representing the emission color of the second LED, is an angle of at least 120° and at most 240°.

The emission color of the first LED and the emission color of the second LED may be characterized in that on the a*b* coordinate plane in the CIE (1976) L*a*b* color space chromaticity diagram, the difference between the length of a line segment that connects the origin and coordinates representing the emission color of the first LED and the length of a line segment that connects the origin and coordinates representing the emission color of the second LED, is less than 20. Further, the emission color of the first LED and the emission color of the second LED may be characterized in that on the a*b* coordinate plane in the CIE (1976) L*a*b* color space chromaticity diagram, as between the length of a line segment that connects the origin and coordinates representing the emission color of the first LED and the length of a line segment that connects the origin and coordinates representing the emission color of the second LED, the ratio of one of them to the other and the ratio of the other to said one of them are at most 2.0.

The emission color of the first LED and the emission color of the second LED may be characterized in that on the a*b* coordinate plane in the CIE (1976) L*a*b* color space chromaticity diagram, the length of a line segment that connects the origin and coordinates representing the emission color of the first LED and the length of a line segment that connects the origin and coordinates representing the emission color of the second LED, are, respectively, at least 5. Further, the construction may be such that on the a*b* coordinate plane in the CIE (1976) L*a*b* color space chromaticity diagram, the coordinates representing the emission color of the first LED are characterized in that the value of $a^*$ is smaller than $-20$ and the value of $b^*$ is smaller than 20, and the coordinates representing the emission color of the second LED are characterized in that the value of $a^*$ is larger than 20 and the value of $b^*$ is larger than $-20$.

In the above LED light emitting device, specifically, the first LED may comprise a first semiconductor light emitting element to be driven by the first drive current to emit light, and a first wavelength conversion member to let a part or whole of the light emitted from the first semiconductor light emitting element undergo wavelength conversion and then radiate the light, and the second LED may comprise a second semiconductor light emitting element to be driven by the second drive current to emit light, and a second wavelength conversion member to let a part or whole of the light emitted from the second semiconductor light emitting element undergo wavelength conversion and then radiate the light.

In such a case, light of the first LED obtained by letting a part or whole of the light emitted from the first semiconductor light emitting element undergo wavelength conversion by the first wavelength conversion member and light of the second LED obtained by letting a part or whole of the light emitted from the second semiconductor light emitting element undergo wavelength conversion by the second wavelength conversion member, are combined and radiated from the LED light emitting device.

In such an LED light emitting device, the first wavelength conversion member may contain a first phosphor to convert the light emitted from the first semiconductor light emitting element to light having a longer wavelength by wavelength conversion and then radiate the light, and the second wavelength conversion member may contain a second phosphor to convert the light emitted from the second semiconductor light emitting element to light having a longer wavelength by wavelength conversion and then radiate the light.

As a specific construction in which the first and second semiconductor light emitting elements and the first and second wavelength conversion members are respectively combined for use, the LED light emitting device may comprise a circuit board on which the first and second semiconductor light emitting elements are mounted, a wall member formed on the circuit board to surround the first and second semiconductor light emitting elements, and a partition member to divide a region inside of the wall member into a first region where the first semiconductor light emitting element is disposed and a second region where the second semiconductor light emitting element is disposed, wherein the first wavelength conversion member is accommodated in the first region, and the second wavelength conversion member is accommodated in the second region.

In such a case, in the first region, one or a plurality of the first semiconductor light emitting elements may be disposed, and in the second region, one or a plurality of the second semiconductor light emitting elements may be disposed.

As another specific construction in which the first and second semiconductor light emitting elements and the first and second wavelength conversion members are respectively combined for use, the LED light emitting device may comprise a circuit board on which a plurality of the first semiconductor light emitting elements and a plurality of the second semiconductor light emitting elements are mounted, wherein the first wavelength conversion member is provided for each of the plurality of the first semiconductor light emitting elements, and the second wavelength conversion member is provided for each of the plurality of the second semiconductor light emitting elements.

In such a case, the plurality of the first semiconductor light emitting elements and the plurality of the second semiconductor light emitting elements are preferably disposed as dispersed on the circuit board so that they are mutually mixed with each other.

Further, in a case where the first and second semiconductor light emitting elements and the first and second wavelength conversion members are respectively combined for use, as mentioned above, as the first semiconductor light emitting element and the second semiconductor light emitting element, it is possible to use a semiconductor light emitting element that emits light having a peak wavelength in a wavelength range of from 360 nm to 420 nm.

The above-described LED light emitting device may be applied to an indicator employing light radiated from the LED light emitting device to carry out an indication depending on the degree of a physical quantity that is changeable at least over a preliminarily estimated changeable range. In such a case, the indicator comprises an indication controller unit to control the drive controller unit so that in response to a change of the physical quantity from the lower limit value to the upper limit value within the changeable range, the first drive current is decreased from a prescribed first upper limit current value to a prescribed first lower limit current value, and at the same time, the second drive current is increased from a prescribed second lower limit current value to a prescribed second upper limit current value.

The indicator having such a construction is designed so that the respective amounts of the first drive current to be supplied to the first LED and the second drive current to be supplied to the second LED, will change in response to a change in the physical quantity, and this physical quantity is changeable at least over a preliminarily estimated changeable range. And, when the physical quantity is at the lower limit value within the changeable range, the first drive current is supplied at a prescribed first upper limit current value, and at the same time, the second drive current becomes to have a prescribed second lower limit current value. Accordingly, at that time, indication of the indicator is carried out by the emission color of the first LED. On the other hand, when the physical quantity is at the upper limit value within the changeable range, the second drive current is supplied at a prescribed second upper limit current value, and at the same time, the first drive current becomes to have a prescribed first lower limit current value. Accordingly, at that time, indication of the indicator is carried out by the emission color of the second LED. When the physical quantity is between the upper limit value and the lower limit value within the changeable range, as the physical quantity becomes close to the lower limit value, the first drive current becomes close to the first upper limit current value and at the same time, the second drive current becomes close to the second lower limit current value, and as the physical quantity becomes close to the upper limit value, the first drive current becomes close to the first lower limit current value and at the same time, the second drive current becomes close to the second upper limit current value. In such a case, a combined color obtained by combining the emission color by the first LED and the emission color by the second LED, is radiated from the LED light emitting device, as an indication of the indicator. At that time, in such a combined color, as the physical quantity becomes close to the lower limit value, the component of the emission color by the first LED increases and at the same time, the component of the emission color by the second LED decreases. On the other hand, as the physical quantity becomes close to the upper limit value, the component of the emission color by the first LED decreases and at the same time, the component of the emission color by the second LED increases. And, as mentioned above, when the emission color of the LED light emitting device to be used for an indication by an indicator, thus changes, in an intermediate region within the changeable range of the emission color of the LED light emitting device, i.e. in a case where the physical quantity is in an intermediate region within its changeable range, a white light is obtainable as a combined light, of which the absolute value of a deviation duv from the blackbody radiation locus is at most 0.02 in the CIE (1931) XYZ color space chromaticity diagram and the color temperature is within a range of from 2,500 K to 10,000 K.

As a specific embodiment, such an indicator may be provided on an electronic device. In such a case, the physical quantity may be a value to be set by an operation member provided to carry out setting of the electronic device.

In a case where such an indicator is provided on an electronic device, the indication color of the indicator changes between the emission color by the first LED and the emission color by the second LED as mentioned above, in response to a change of the physical quantity to be set by the operation member, and in an intermediate region within the changeable range of the emission color of the LED emitting device, i.e. in a case where the value set by the operation member is in an intermediate region within its changeable range, a white light as mentioned above is radiated as an indication of the indicator.

As another specific embodiment, the above indicator may be mounted on a vehicle. In such a case, the physical quantity may be an operating condition quantity that changes in accordance with the operating condition of the vehicle.

In a case where such an indicator is mounted on a vehicle, the indication color of the indicator changes between the emission color by the first LED and the emission color by the second LED as mentioned above in response to a change of the operating condition quantity of the vehicle, and in an intermediate region within the changeable range of the emission color of the LED light emitting device, a white light as mentioned above is radiated as an indication of the indicator.

Advantageous Effects of Invention

According to the LED light emitting device of the present invention, the drive controller unit controls the first drive current to be supplied to the first LED and the second drive current to be supplied to the second LED, respectively, whereby the chromaticity of a combined light obtainable by variously changing the ratio of the respective visible lights from the first and second LEDs, changes within the changeable range of chromaticity where the color difference is larger than 0.04 in the CIE (1976) L*u*v* color space chromaticity diagram, and thus can be made to be one which is different in a clearly distinguishable level from the emission color of the first LED and the emission color of the second LED. Furthermore, in an intermediate region within this changeable range of chromaticity, a white light is obtainable as a combined light, of which the absolute value of a deviation duv from the blackbody radiation locus is at most 0.02 in the CIE (1976) L*u*v* color space chromaticity diagram and the color temperature is within a range of from 2,500 K to 10,000 K, and thus it becomes possible to realize a distinct change of the emission color and at the same time, a highly distinguishable white light can be obtained even in an intermediate region within the changeable range of the emission color.

Further, in a case where such a drive controller unit of the LED light emitting device is designed to control the first and second drive currents so that the chromaticity of a combined light moves on a line that connects the chromaticity of the emission color of the first LED and the chromaticity of the emission color of the second LED, the drive controller unit may be made to be simply constructed.

In such a case, when it is so designed that the line that connects the chromaticity of the emission color of the first LED and the chromaticity of the emission color of the second LED, passes through a chromaticity point where X is at least 0.32 and at most 0.34, and Y is at least 0.32 and at most 0.34 in the CIE (1931) XYZ color space, it becomes possible to have a white color of daylight color radiated from the LED light emitting device in an intermediate region within the changeable range of the emission color, whereby the distinguishability can further be increased.

In a case where the emission color of the first LED and the emission color of the second LED are in a complementary color relation to each other, the above-mentioned effect such that it becomes possible to realize a distinct change of the emission color over the entire region within the changeable range of the emission color of the LED light emitting device, becomes more distinct. Here, as mentioned above, "in a complementary color relation to each other" means that they are in a point symmetrical relation about the 0 point in the CIE 1976 (L*a*b*) color space, but is not limited to a strict point symmetrical relation. Specifically, in a case where on the a*b* coordinate plane represented by the CIE 1976 (L*a*b*) color space, a color phase is represented by an angle $\theta_a^*$ of a line segment OC connecting the 0 point (a*=0, b*=0) and color point C, from the a* axis, it is preferred that a difference between the respective angles $\theta_a^*$ of color points of the two emission colors is at least 120° and at most 240°. That is, the emission color of the first LED and the emission color of the second LED are preferably such that on the a*b* coordinate plane in the CIE (1976) L*a*b* color space chromaticity diagram, the angle between a line segment that connects the origin and coordinates representing the emission color of the first LED and a line segment that connects the origin and coordinates representing the emission color of the second LED, is an angle of at least 120° and at most 240°. By such a construction, even in a case where the emission color of the first LED and the emission color of the second LED are not strictly in a point symmetrical relation on the a*b* coordinate plane in the CIE (1976) L*a*b* color space chromaticity diagram, a white color is radiated in the course of change from the emission color of the first LED 301 to the emission color of the second LED 302, and it is possible to realize a distinct change of the emission color. Since the emission color of the first LED 301 and the emission color of the second LED 302 are not required to be strictly in a point symmetrical relation on the a*b* coordinate plane in the CIE (1976) L*a*b* color space chromaticity diagram, it is possible to flexibly determine the emission color of the first LED 301 and the emission color of the second LED 302.

The emission color of the first LED 301 and the emission color of the second LED 302 may be such that on the a*b* coordinate plane in the CIE (1976) L*a*b* color space chromaticity diagram, the difference between the length of a line segment that connects the origin and coordinates representing the emission color of the first LED 301 and the length of a line segment that connects the origin and coordinates representing the emission color of the second LED 302, is less than 20. Further, the emission color of the first LED 301 and the emission color of the second LED 302 may be such that on the a*b* coordinate plane in the CIE (1976) L*a*b* color space chromaticity diagram, as between the length of a line segment that connects the origin and coordinates representing the emission color of the first LED 301 and the length of a line segment that connects the origin and coordinates representing the emission color of the second LED 302, the ratio of one of them to the other and the ratio of the other to said one of them are at most 2.0. By such a construction, in the course of change from the emission color of the first LED 301 to the emission color of the second LED 302 or in the course of change from the emission color of the second LED 302 to the emission color of the first LED 301, a white light can be radiated in an intermediate region. Therefore, in a case where an LED light emitting device having such a construction is applied for indication of a physical quantity, for example, when the physical quantity is minimum, such a state is indicated by the emission color of the first LED 301, when the physical quantity is maximum, such a state is indicated by the emission color of the second LED 302, and when the physical quantity is at an intermediate level, such a state is indicated by a white color, and thus, the change of the physical quantity can easily be recognized.

The emission color of the first LED 301 and the emission color of the second LED 302 may be such that on the a*b* coordinate plane in the CIE (1976) L*a*b* color space chromaticity diagram, the length of a line segment that connects the origin and coordinates representing the emission color of the first LED 301 and the length of a line segment that connects the origin and coordinates representing the emission color of the second LED 302, are, respectively, at least 5. By such a construction, the emission color of the first LED 301 and the emission color of the second LED 302 are different from a white color, and in the course of change from the emission color of the first LED 301 to the emission color of the second LED 302, it is possible to make the change of the color of light emitted from the LED light emitting device more certainly recognizable. Further, the construction may be such that on the a*b* coordinate plane in the CIE (1976) L*a*b* color space chromaticity diagram, the coordinates representing the emission color of the first LED are characterized in that the value of a* is smaller than −20 and the value of b* is smaller than 20, and the coordinates representing the emission color of the second LED are characterized in that the value of a* is larger than 20 and the value of b* is larger than −20. By such a construction, from the first LED, a light with a color capable of giving an impression of "safe", "normal", "cold", "cool" or the like, is usually emitted, and from the second LED, a light with a color capable of giving an impression of "danger", "abnormal", "warm", "hot" or the like, is usually emitted. That is, the impression to be given by the light emitted from the first LED may be made to be in contrast with the impression to be given by the light emitted from the second LED. Thus, the impression to be given to the observer of the light emitted from the LED light emitting device can be changed to a contrasting impression.

In a case where in the LED light emitting device, the first and second semiconductor light emitting elements and the first and second wavelength conversion members are respectively combined for use, as compared with a case where emission colors of the semiconductor light emitting elements themselves are used for combination, the emission spectrum widths of the first and second LED will be broadened, whereby it becomes possible to obtain a radiated light having superior color rendering properties.

Further, in such an LED light emitting device, when the first and second semiconductor light emitting elements mounted on a circuit board, are separately enclosed by a wall member and a partition member, and the first wavelength conversion member is accommodated in a first region where the first semiconductor light emitting element is disposed and the second wavelength conversion member is accommodated in a second region where the second semiconductor light emitting element is disposed, handling of the LED light emitting device becomes easy, and such a construction is particularly advantageous e.g. in a case where plural LED light emitting devices are used in combination.

Particularly when pluralities of the first and second semiconductor light emitting elements are used, by constructing the LED light emitting device in such a manner, the advantageous effects become distinct, and also the effect to reduce the production cost increases.

On the other hand, in a case where pluralities of the first and second semiconductor light emitting elements are mounted on the circuit board, and the first wavelength conversion member is provided for each of the plurality of the first semiconductor light emitting elements and the second wavelength conversion member is provided for each of the plurality of the second semiconductor light emitting elements, the degree of freedom in layout of the first and second semiconductor light emitting elements increases.

In such a case, particularly when the plurality of the first semiconductor light emitting elements and the plurality of the second semiconductor light emitting elements are disposed as dispersed on the circuit board so that they are mutually mixed, it is possible to combine lights emitted respectively from the first and second LEDs more efficiently.

In a case where the LED light emitting device of the present invention is applied to an indicator to carry out an indication depending on the degree of a physical quantity that is changeable at least over a preliminarily estimated changeable range, the emission color of the LED light emitting device as an indication of the indicator changes within the changeable range from the emission color by the first LED, via a combined color having emission colors of the first and second LEDs combined, to the emission color of the second LED. Thus, as mentioned above, it becomes possible to realize an indication accompanied by a distinct change of the indication color, in response to a change of the physical quantity. Further, the emission color of the LED light emitting device changes via a highly distinguishable white color, whereby it becomes possible to clearly recognize that the physical quantity is in an intermediate region within its changeable range.

DESCRIPTION OF EMBODIMENTS

Figure 1:
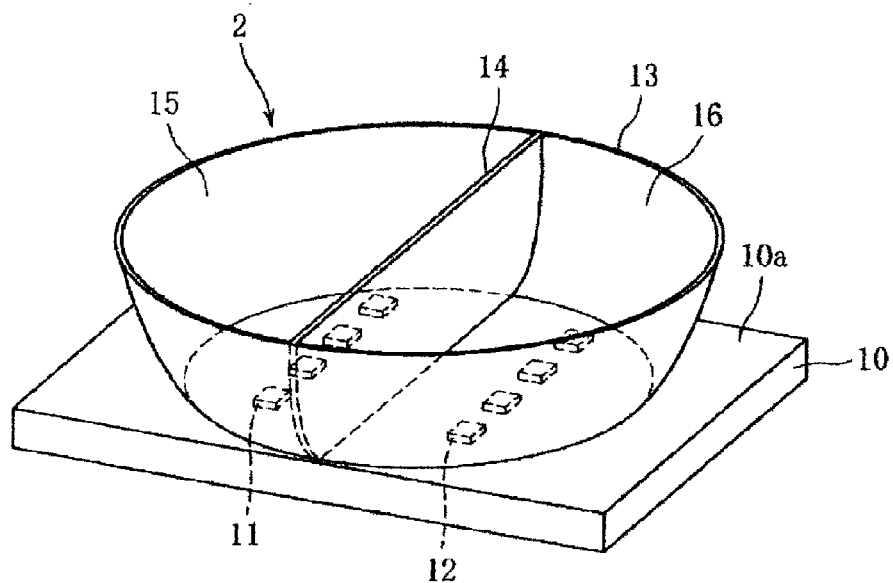
FIG. 1 is a perspective view schematically illustrating an emission module of an LED light emitting device according to one embodiment of the present invention.

Now, embodiments of the present invention will be described in detail with reference to the drawings. However, it should be understood that the present invention is by no means limited to the following contents and may be carried out by optionally modifying them within a range not departing from the concept of the present invention. Further, the drawings to be used for the following description are ones schematically showing e.g. the LED light emitting device of the present invention, etc., and in order to promote better understanding, partial emphasis, enlargement, contraction, omission or the like is made, so that the sizes, shapes, etc. of various constituting members shown in the drawings may not necessarily be accurate. Further, various numerical values used in the following description are merely exemplary and may be variously changed as the case requires.

<Construction of Emission Module>

Figure 2:
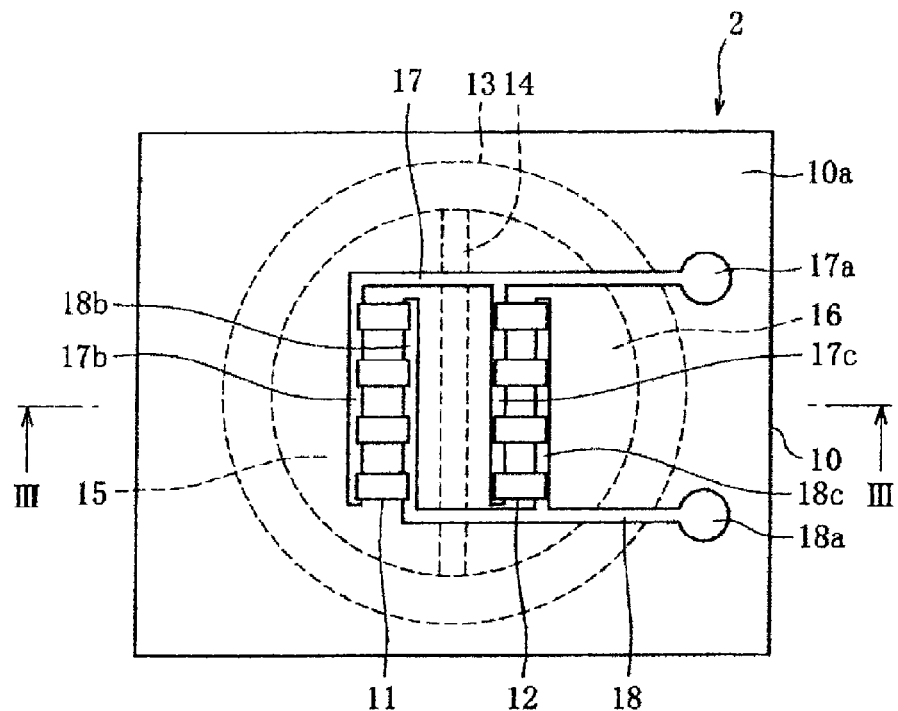
FIG. 2 is a plan view schematically illustrating the emission module of FIG. 1.
Figure 3:
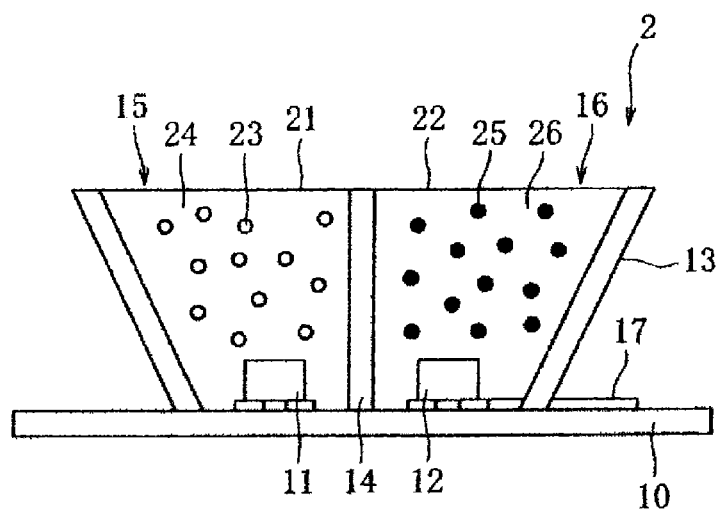
FIG. 3 is a cross-sectional view schematically illustrating the cross-section along the line in FIG. 2.

FIG. 1 is a perspective view schematically illustrating an emission module 2 to be used in an LED light emitting device 1 according to one embodiment of the present invention, FIG. 2 is a plan view schematically illustrating the emission module 2, and FIG. 3 is a cross-sectional view schematically showing the cross-section along the line III-III in FIG. 2. While details of the LED light emitting device 1 will be described later, the emission module 2 is designed to be used in combination with the after-described drive unit 3, in the LED light emitting device 1.

The emission module 2 has four first semiconductor light emitting elements 11 and four second semiconductor light emitting elements 12, mounted on a light emitting element-mounting surface 10a of a circuit board 10 made of an alumina ceramics and having excellent electrical insulating properties and good heat dissipation properties. Further, on the light emitting element-mounting surface 10a of the circuit board 10, a ring-shaped and truncated cone-shaped reflector (wall member) 13 is formed to surround these first and second semiconductor light emitting elements 11 and 12. And, inside of the reflector 13 is divided by a partition member 14 into a first region 15 and a second region 16. Here, the reflector 13 and the partition member 14 may be formed of a resin, a metal, ceramics or the like, and they are fixed to the circuit board 10 by using e.g. an adhesive. In a case where a material having electrical conductivity is to be used for the reflector 13 and the partition member 14, treatment will be required to provide an electrical insulating property for the after-described wiring patterns.

Here, the number of the first and second semiconductor light emitting elements 11 and 12 is exemplary and may be increased or decreased as the case requires, and it may be one, respectively. Further, the material for the circuit board 10 is not limited to an alumina ceramics, and various materials may be used. For example, a material selected from ceramics, resins, glass epoxy, composite resins having fillers incorporated in resins, etc., may be used. Further, it is also possible to improve the heat dissipation properties by using a substrate made of a metal, such as a substrate made of copper or a substrate made of aluminum. In such a case, however, it is required to interpose an electrical insulating layer when wiring patterns are formed on the circuit board.

Further, the above-mentioned shapes of the reflector 13 and the partition member 14 are also exemplary and may be variously changed as the case requires. For example, instead of the preliminarily molded reflector 13 and partition member 14, by means of e.g. a dispenser, a ring-shaped wall (wall member) corresponding to the reflector 13 may be formed on the light emitting element-mounting surface 10a of the circuit board 10, and then, a partition wall (partition member) corresponding to the partition member 14 may be formed. In such a case, as a material to be used for these ring-shaped wall and partition wall, for example, a paste-form thermosetting resin material or UV curable resin material is available, and a silicone resin having an inorganic filler incorporated, is preferred.

As shown in FIGS. 1 and 2, in the first region 15 inside of the reflector 13, four first semiconductor light emitting elements 11 are disposed in line in parallel with the extension direction of the partition member 14, and in the second region 16 inside of the reflector 13, four second semiconductor light emitting elements 12 are disposed in line in the same direction as the disposition direction of the first semiconductor light emitting elements 11. In FIG. 2, the reflector 13 and the partition member 14 are shown by dashed lines, for convenience sake On the light emitting element-mounting surface 10a of the circuit board 10, a wiring pattern 17 and a wiring pattern 18 are formed as shown in FIG. 2 to form the after-described electric circuits to supply the drive currents to the first and second semiconductor light emitting elements 11 and 12, respectively. The wiring pattern 17 has a connection terminal 17a for external connection formed at its one end, and at the other end, a first semiconductor light emitting element-mounting portion 17b is formed to extend in parallel with the extension direction of the partition member 14, as shown in FIG. 2. And, the connection terminal 17a is located outside of the reflector 13, while the first semiconductor light emitting element-mounting portion 17b is disposed in the first region 15 inside of the reflector 13. Further, the wiring pattern 17 is provided with a second semiconductor light emitting element-mounting portion 17c branched from an intermediate portion located in the second region 16 inside of the reflector 13 and extending in parallel with the extension direction of the partition member 14

On the other hand, the wiring pattern 18 has a connection terminal 18a for external connection formed at its one end, and at the other end, a first semiconductor light emitting element-mounting portion 18b is formed to extend in parallel with the first semiconductor light emitting element-mounting portion 17b of the wiring pattern 17, as shown in FIG. 2. And, the connection terminal 18a is located outside of the reflector 13, while the first semiconductor light emitting element-mounting portion 18b is disposed in the first region 15 inside of the reflector 13. Further, the wiring pattern 18 is provided with a second semiconductor light emitting element-mounting portion 18c branched from an intermediate portion located in the second region 16 inside of the reflector 13 and extending in parallel with the second semiconductor light emitting element-mounting portion 17c of the wiring pattern 17.

The four first semiconductor light emitting elements 11 are connected in parallel with one another in the same polar direction between the first semiconductor light emitting element-mounting portion 17b of the wiring pattern 17 and the first semiconductor light emitting element-mounting portion 18b of the wiring pattern 18. The four second semiconductor light emitting elements 12 are connected in parallel with one another in the same polar direction between the second semiconductor light emitting element-mounting portion 17c of the wiring pattern 17 and the second semiconductor light emitting element-mounting portion 18c of the wiring pattern 18.

More specifically, each of the first semiconductor light emitting elements 11 and the second semiconductor light emitting elements 12 has two electrodes (not shown) to supply the drive current, on the circuit board 10 side. And, of each first semiconductor light emitting element 11, one electrode (e.g. p-electrode) is connected to the first semiconductor light emitting element-mounting portion 17b of the wiring pattern 17, and at the same time, the other electrode (e.g. n-electrode) is connected to the first semiconductor light emitting element-mounting portion 18b of the wiring pattern 18. Further, of each second semiconductor light emitting element 12, one electrode (e.g. p-electrode) is connected to the second semiconductor light emitting element-mounting portion 18c of the wiring pattern 18, and at the same time, the other electrode (e.g. n-electrode) is connected to the second semiconductor light emitting element-mounting portion 17c of the wiring pattern 17.

Such mounting of the first and second semiconductor light emitting elements 11 and 12 and connection of both electrodes to the wiring patterns 17 and 18, are carried out by employing flip chip mounting and via a metal bump or via eutectic solder, not shown in the drawings. Here, the method for mounting the first and second semiconductor light emitting elements 11 and 12 on the circuit board 10 is not limited to such a method, and any suitable method may be selected for use depending on e.g. the type or structure of these semiconductor light emitting elements. For example, double wire bonding may be employed wherein the first and second semiconductor light emitting elements 11 and 12 are, respectively, bonded and fixed at prescribed positions on the circuit board 10, and the respective electrodes of the first and second semiconductor light emitting elements 11 and 12 are connected to the corresponding wiring patterns by wire bonding, or single wire bonding may be employed wherein one of the electrodes is connected to the wiring pattern as described above, and the other electrode is connected to the wiring pattern by wire bonding.

As shown in FIG. 3, in the first region 15 inside of the reflector 13, the first phosphor member (the first wavelength conversion member) 21 is accommodated to cover the four first semiconductor light emitting elements 11, while in the second region 16 inside of the reflector 13, the second phosphor member (the second wavelength conversion member) 22 is accommodated to cover the four second semiconductor light emitting elements 12. The first phosphor member 21 comprises a first phosphor 23 which is to be excited by light emitted from the first semiconductor light emitting element 11 to radiate light with a wavelength different from light emitted from the first semiconductor light emitting element 11, and a first filler 24 in which the first phosphor 23 is dispersed and held. Further, the second phosphor member 22 comprises a second phosphor 25 which is to be excited by light emitted from the second semiconductor light emitting element 12 to radiate light with a wavelength different from light emitted from the second semiconductor light emitting element 12, and a second filler 26 in which the second phosphor 25 is dispersed and held.

Thus, in this embodiment, the four first semiconductor light emitting elements 11 and the first phosphor member 21 to cover them, form a first LED of the present invention, and the four second semiconductor light emitting elements 12 and the second phosphor member 22 to cover them, form a second LED of the present invention. By combining a plurality of first semiconductor light emitting elements 11 with the first phosphor member 21 and at the same time, by combining a plurality of second semiconductor light emitting elements 12 with the second phosphor member 22, in such a way, to form an emission module 2, handling of the LED light emitting device 1 becomes easy, such being advantageous e.g. in a case where a plurality of LED light emitting devices 1 are to be used in combination.

<Semiconductor Light Emitting Elements>

Each of the first and second semiconductor light emitting elements 11 and 12 to be used in this embodiment, is an LED chip that emits near ultraviolet light having a peak wavelength of 405 nm. Specifically, as such an LED chip, a GaN type LED chip or the like is preferred wherein an InGaN semiconductor is used for a light emitting layer to emit light in a near infrared region. Further, the types or emission wavelength properties of these first and second semiconductor light emitting elements 11 and 12 are not limited thereto, and semiconductor light emitting elements of various LED chips, etc. may be used without departing from the concept of the present invention. In this embodiment, the peak wavelength of light emitted from the first and second semiconductor light emitting elements 11 and 12 is preferably within a wavelength range of from 360 nm to 420 nm, more preferably within a wavelength range of from 390 nm to 415 nm.

<Phosphor Members>

In the first phosphor member 21, the first phosphor 23 to let a part or whole of near ultraviolet light emitted from the first semiconductor light emitting elements 11 undergo wavelength conversion to radiate visible light, is dispersed and held in the first filler 24, and in the second phosphor member 22, the second phosphor 25 to let a part or whole of near ultraviolet light emitted from the second semiconductor light emitting elements 12 undergo wavelength conversion to radiate visible light, is dispersed and held in the second filler 26. In the following, firstly a method for selecting these first and second phosphors 23 and 25 will be described in detail.

Figure 4:
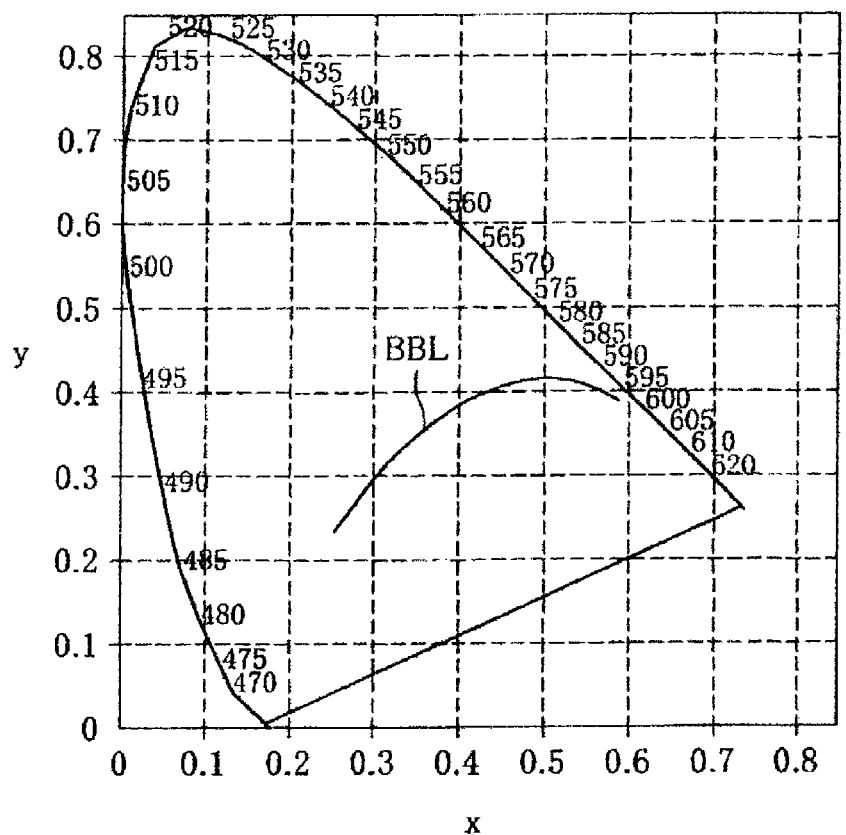
FIG. 4 is a graph showing the blackbody radiation locus in the CIE (1931) XYZ color space chromaticity diagram.
Figure 5:
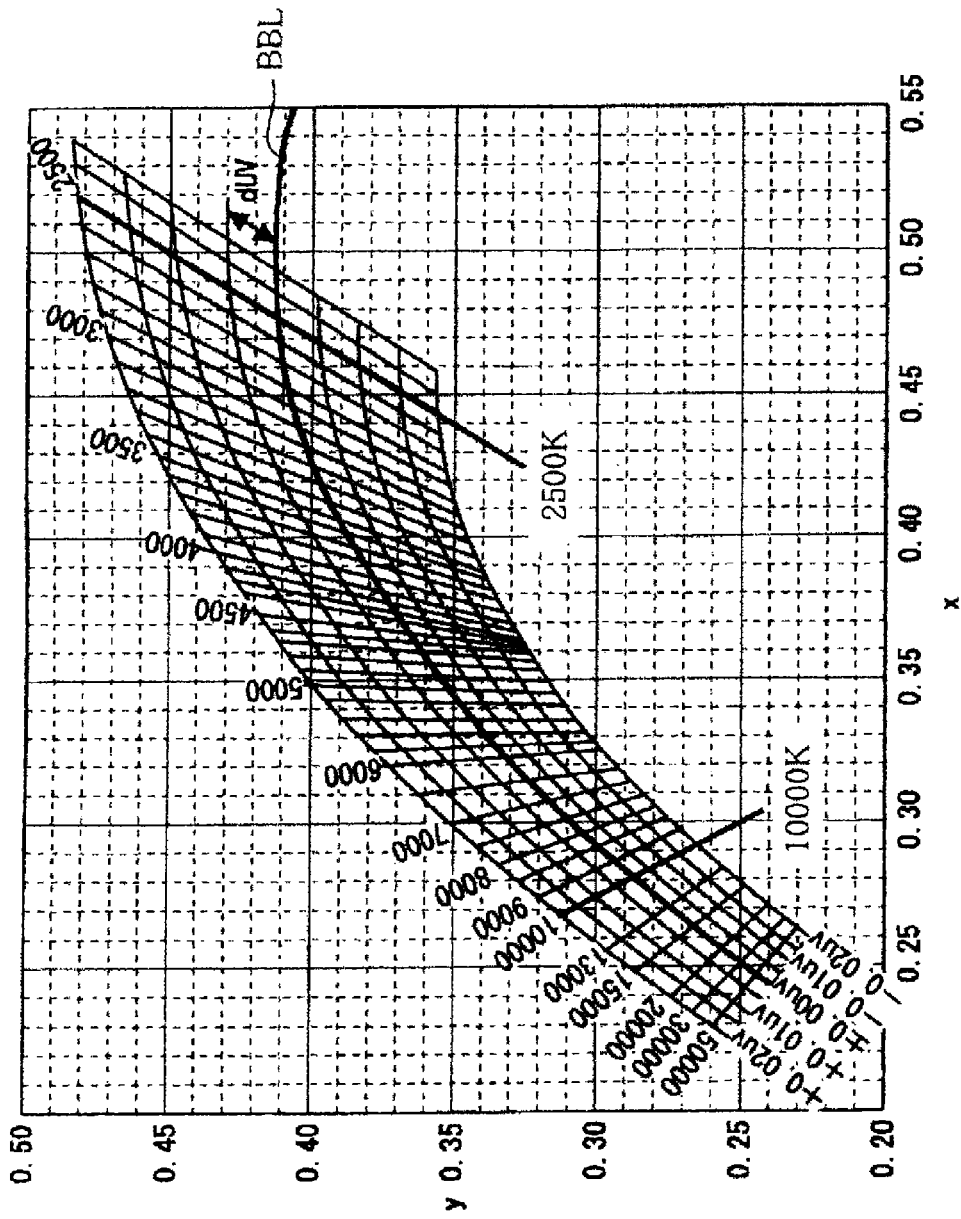
FIG. 5 is an enlarged view of the essential portion of FIG. 4 showing the relation between the blackbody radiation locus, and the isotemperature lines and isanomal in the CIE(1931) XYZ color space chromaticity diagram.

FIG. 4 is a graph showing the blackbody radiation locus BBL in the CIE (1931) XYZ color space chromaticity diagram, and FIG. 5 is an enlarged view of the essential portion of FIG. 4. In FIG. 5, the relation between the blackbody radiation locus BBL and the isotemperature lines is shown together with isanomal representing a deviation duv from the blackbody radiation locus BBL. Here, the deviation duv from the blackbody radiation locus BBL as shown in FIG. 5 is one having the deviation from the blackbody radiation in the CIE (1976) L*u*v* color space converted to the CIE (1931) XYZ color space, and the conversion method is well known. Therefore, although its detailed explanation is omitted here, the chromaticity coordinates (u', v') in the CIE (1976) L*u*v* color space chromaticity diagram can be converted to chromaticity coordinates (x, y) in the CIE (1931) XYZ color space by the following formulae (1) and (2). In the description of this embodiment, reference is made to idiomatically understandable CIE (1931) XYZ color space.

$$x=9u'/(6u'-16v'+12) \quad (1)$$

$$y=4v'/(6u'-16v'+12) \quad (2)$$

Figure 6:
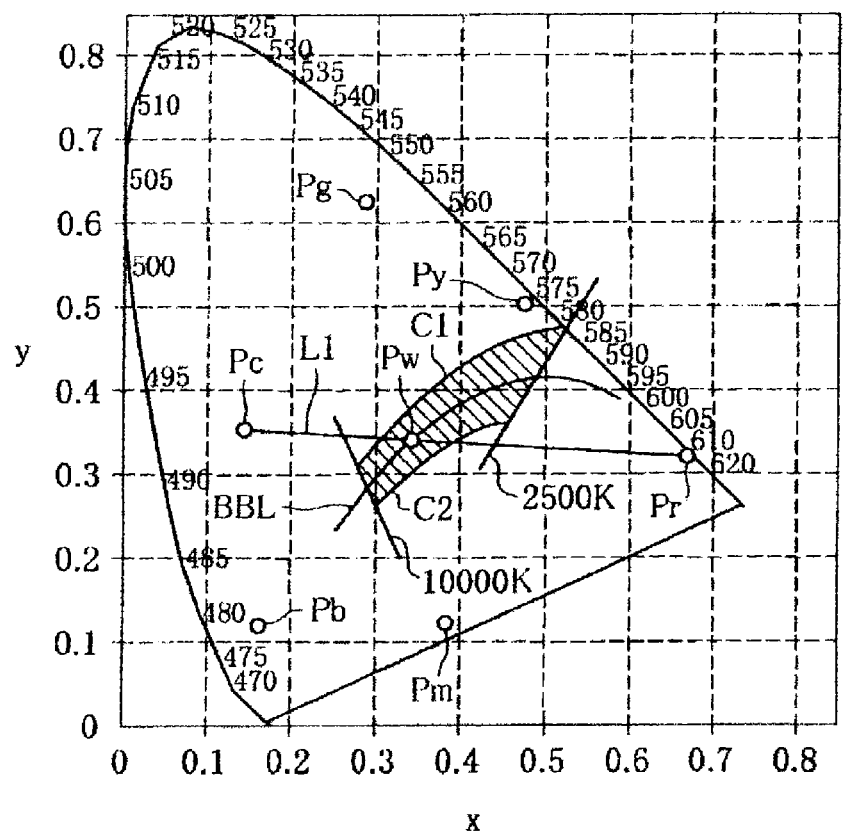
FIG. 6 is a graph showing the relation of the emission color from the first phosphor member and the emission color from the second phosphor member to the white light region in the CIE (1931) XYZ color space chromaticity diagram.

In this embodiment, light having its chromaticity point located in a region in the CIE (1976) L*u*v* color space chromaticity diagram, wherein the absolute value of a deviation duv from the blackbody radiation locus BBL is at most 0.02 and the color temperature is within a range of from 2,500 K to 10,000 K, is defined as a white light, and hereinafter, such a region will be referred to as a white light region. FIG. 6 is, like FIG. 4, a graph showing the blackbody radiation locus BBL in the CIE (1931) XYZ color space chromaticity diagram. In the chromaticity diagram of FIG. 6, curve C1 is isanomal of the deviation duv=0.02 in FIG. 5, and curve C2 is isanomal of the deviation duv=−0.02 in FIG. 5. Therefore, in the chromaticity diagram in FIG. 6, the region defined by curve C1, the isotemperature line of 2,500 K, curve C2 and the isotemperature line of 10,000 K, is the white light region in this embodiment.

As the first phosphor, such a phosphor is selected that emits visible light having a chromaticity such that in the CIE (1976) L*u*v* color space chromaticity diagram, the deviation duv from the blackbody radiation locus becomes larger than 0.02. Accordingly, the chromaticity point of light radiated from the first phosphor 23 obtainable by wavelength conversion of near ultraviolet light from the first semiconductor light emitting elements 11, will be located outside of the white light region shown in the chromaticity diagram in FIG. 6. Whereas, as the second phosphor 25, such a phosphor is selected that emits visible light having a chromaticity such that in the CIE (1976) L*u*v* color space chromaticity diagram, the deviation duv from the blackbody radiation locus becomes smaller than −0.02. Accordingly, the chromaticity point of light radiated from the second phosphor 25 obtainable by wavelength conversion of near ultraviolet light from the second semiconductor light emitting elements 12, will also be located outside of the white light region shown in the chromaticity diagram in FIG. 6. And, the chromaticity point of light radiated from the first phosphor and the chromaticity point of light radiated from the second phosphor will be located on mutually different sides relative to the blackbody radiation locus BBL in the chromaticity diagram in FIG. 6.

That is, as the first and second phosphors 23 and 25, such two types of phosphors may be selected that in the chromaticity diagram in FIG. 6, the chromaticity point of light radiated from each of them is located outside of the white light region, and at the same time, the chromaticity point of light radiated from one of them and the chromaticity point of light radiated from the other are located on mutually opposite sides relative to the blackbody radiation locus BBL.

In this embodiment, specifically, two types of phosphors which are mutually in such a relation that in the chromaticity diagram in FIG. 6, they face each other across EEW (Equal Energy White) represented by chromaticity point Pw (x=0.33, y=0.33) within the white light region and at the same time, their chromaticity points are located outside of the white light region, are selected as the first and second phosphors 23 and 25. More specifically, for example, a cyan color phosphor to radiate a cyan color light (bluish green light) having a chromaticity represented by chromaticity point Pc in the chromaticity diagram in FIG. 6 is selected as the first phosphor 23, and a red color phosphor to radiate a red color light which is in a complementary color relation to the cyan color light radiated from the first phosphor and which has a chromaticity represented by chromaticity point Pr in the chromaticity diagram in FIG. 6, is selected as the second phosphor 25.

Phosphors to be selected as the first and second phosphors 23 and 25 are not limited to the above-mentioned cyan color phosphor and red color phosphor, and various phosphors may be used within a range not departing from the concept of the present invention. For example, other than the combination of the cyan color phosphor and the red color phosphor, two types of phosphors may be selected so that their radiated colors are in a complementary color relation to each other. As a specific example of such a case, e.g. a green color phosphor to radiate a green color light having a chromaticity represented by chromaticity point Pg in the chromaticity diagram in FIG. 6, may be used as the first phosphor 23, and at the same time, a magenta color phosphor to radiate a magenta color light (reddish purple color light) having a chromaticity represented by chromaticity point Pm in the chromaticity diagram in FIG. 6, may be used as the second phosphor 25. Or, a yellow color phosphor to radiate a yellow color light having a chromaticity represented by chromaticity point Py in the chromaticity diagram in FIG. 6, may be used as the first phosphor 23, and at the same time, a blue color phosphor to radiate a blue color light having a chromaticity represented by chromaticity point Pb in the chromaticity diagram in FIG. 6, may be used as the second phosphor 25.

Further, colors of lights radiated from the first and second phosphors 23 and 25 may not be strictly in a relation to face each other across EEW represented by chromaticity point Pw (x=0.33, y=0.33) as mentioned above. That is, in the present invention, "in a complementary color relation to each other" means that they are in a point symmetrical relation about the 0 point in the CIE 1976 (L*a*b*) color space. More specifically, in a case where on the a*b* coordinate plane represented by the CIE 1976 (L*a*b*) color space, a color phase is represented by an angle $\theta_a^*$ of a line segment OC connecting the 0 point (a*=0, b*=0) and color point C, from the a* axis, it is preferred that a difference between the respective angles $\theta_a^*$ of color points of the two emission colors is at least 120° and at most 240°.

Further, colors of lights radiated from the first and second phosphors 23 and 25 may not be in a complementary color relation to each other. That is, as mentioned above, as the first and second phosphors 23 and 25, such two types of phosphors may be selected that in the chromaticity diagram in FIG. 6, the chromaticity point of light radiated from each of them is located outside of the white light region, and at the same time, the chromaticity point of light radiated from one of them and the chromaticity point of light radiated from the other are located on mutually opposite sides relative to the blackbody radiation locus BBL. In such a case, instead of the above-mentioned EEL represented by chromaticity point Pw, a chromaticity point to be the base may be set in the vicinity thereof. At that time, in the CIE (1931) XYZ color space chromaticity diagram, it is preferred that X is at least 0.32 and at most 0.34, and Y is at least 0.32 and at most 0.34. Further, a white light having such a chromaticity point becomes to have a daylight color.

Further, a phosphor to be used for at least one of the first and second phosphors 23 and 25 may not be a single phosphor, and a plurality of phosphors may be used as mixed. Further, even when a phosphor is called by the same name, such as a red color phosphor or a blue color phosphor, the emission peak wavelength may vary depending upon the constituting components, and depending upon the emission peak wavelength, there may be a case where it is useful as the first phosphor 23, or a case where it is useful as the second phosphor 25. In the following, specific examples of various phosphors will be presented which may be used as either one of the first and second phosphors 23 and 25.

(Cyan Color Phosphors)

Cyan color phosphors include, for example, a halophosphate type phosphor such as $(Ba, Ca, Mg)_{10}(PO_4)_6Cl_2:Eu^{2+}$ (peak wavelength: 483 nm), a phosphate type phosphor such as $2SrO.0.84P_2O_5.0.16B_2O_3:Eu^{2+}$ (peak wavelength: 480 nm), a silicate type phosphor such as $Sr_2Si_3O_8.2SrCl_2:Eu^{2+}$ (peak wavelength: 490 nm), an aluminate type phosphor such as $BaAl_8O_{13}:Eu^{2+}$ (peak wavelength: 480 nm), $BaMg_2Al_{16}O_{27}:Eu^{2+}, Mn^{2+}$ (peak wavelength: 450 nm, 515 nm), $SrMgAl_{10}O_{17}:Eu^{2+}$ (peak wavelength: about 480 nm) or $Sr_4Al_{14}O_{25}:Eu^{2+}$ (peak wavelength: about 480 nm), an oxynitride type phosphor such as $BaSi_2N_2O_2:Eu^{2+}$ (peak wavelength: about 480 nm), etc.

Further, instead of a single cyan color phosphor, a plurality of cyan color phosphors may be used as mixed, or a blue color phosphor and a green color phosphor may suitably be added to adjust the radiation light to have a cyan color.

(Red Color Phosphors)

Emission peak wavelengths of red color phosphors are usually within a wave length range of at least 570 nm, preferably at least 580 nm, more preferably at least 585 nm and usually within a wavelength range of at most 780 nm, preferably at most 700 nm, more preferably at most 680 nm. As the red color phosphor, particularly preferred is e.g. $(Ca, Sr, Ba)_2Si_5(N, O)_8:Eu$, $(Ca, Sr, Ba)Si(N, O)_2:Eu$, $(Ca, Sr, Ba)AlSi(N, O)_3:Eu$, $(Sr, Ba)_3SiO_5:Eu$, $(Ca, Sr)S:Eu$, $(La, Y)_2O_2S:Eu$, a β-diketone type Eu complex such as an $Eu(dibenzoylmethane)_3.1,10$-phenanthroline complex, a carboxylic acid type Eu complex, or $K_2SiF_6:Mn$. More preferred is $(Ca, Sr, Ba)_2Si_5(N, O)_8:Eu$, $(Sr, Ca)AlSi(N, O)_3:Eu$, $(La, Y)_2O_2S:Eu$ or $K_2SiF_6:Mn$.

(Orange Color Phosphors)

Among red color phosphors, those having emission peak wavelengths within a range of at least 580 nm, preferably at least 590 nm and at most 620 nm, preferably at most 610 nm, may suitably be used as orange color phosphors. Such orange color phosphors include, for example, $(Sr, Ba)_3SiO_5:Eu$, $(Sr, Ba)_2SiO_4:Eu$, $(Ca, Sr, Ba)_2Si_5(N, O)_8:Eu$, $(Ca, Sr, Ba)AlSi(N, O)_3:Ce$, etc.

(Green color phosphors)

Emission peak wavelengths of green color phosphors are usually within a wavelength range of at least 500 nm, preferably at least 510 nm, more preferably at least 515 nm and usually less than 550 nm, preferably at most 542 nm, more preferably at most 535 nm. As a green color phosphor, particularly preferred is e.g. $Y_3(Al, Ga)_5O_{12}:Ce$, $CaSc_2O_4:Ce$, $Ca_3(Sc, Mg)_2Si_3O_{12}:Ce$, $(Sr, Ba)_2SiO_4:Eu$, $(Si, Al)_6(O, N)_8:Eu(β-SiAlON)$, $(Ba, Sr)_3Si_6O_{12}:N_2:Eu$, $SrGa_2S_4:Eu$, or $BaMgAl_{10}O_{17}:Eu, Mn$.

(Magenta Color Phosphors)

In order to obtain a phosphor to radiate magenta color light, a red color phosphor and a blue color phosphor may suitably be mixed so that the radiation light becomes to have a magenta color. A specific combination of phosphors to bring the radiation light to have a magenta color, may, for example, be preferably a combination wherein as the red color phosphor, $CaAlSiN_3:Eu$ is used, and as the blue color phosphor, $(Ca, Sr, Ba)MgAl_{10}O_{17}:Eu$ is used.

(Yellow Color Phosphors)

Emission peak wavelengths of yellow color phosphors are usually within a wavelength range of at least 530 nm, preferably at least 540 nm, more preferably at least 550 nm and usually at most 620 nm, preferably at most 600 nm, more preferably at most 580 nm. As the yellow color phosphor, particularly preferred is e.g. $Y_3Al_5O_{12}:Ce$, $(Y, Gd)_3Al_5O_{12}:Ce$, $(Sr, Ca, Ba, Mg)_2SiO_4:Eu$, $(Ca, Sr)Si_2N_2O_2:Eu$, α-SiAlON or $La_3Si_6N_{11}:Ce$.

(Blue Color Phosphors)

Emission peak wavelengths of blue color phosphors are usually within a wavelength range of at least 420 nm, preferably at least 430 nm, more preferably at least 440 nm and usually less than 500 nm, preferably at most 490 nm, more preferably at most 480 nm, further preferably at most 470 nm, particularly preferably at most 460 nm. As the blue color phosphor, particularly preferred is e.g. $(Ca, Sr, Ba)MgAl_{10}O_{17}:Eu$, $(Sr, Ca, Ba, Mg)_{10}(PO_4)_6(Cl,F)_2:Eu$, $(Ba, Ca, Mg, Sr)_2SiO_4:Eu$, or $(Ba, Ca, Sr)_3MgSi_2O_8:Eu$. More preferred is $(Ba, Sr)MgAl_{10}O_{17}:Eu$, $(Ca, Sr, Ba)_{10}(PO_4)_6(Cl, F)_2:Eu$, or $Ba_3MgSi_2O_8:Eu$. Particularly preferred is $Sr_{10}(PO_4)_6Cl_2:Eu$, or $BaMgAl_{10}O_{17}:Eu$.

(Filler)

As the first filler 24 to disperse and hold the first phosphor 23, or the second filler 26 to disperse and hold the second phosphor 25, a thermoplastic resin, a thermosetting resin, a photocurable resin or the like may be used, but it is preferred to use a material having sufficient transparency and durability, to near ultraviolet light to be emitted from the first or second semiconductor light emitting element 11 or 12. Specifically, a (meth)acrylic resin such as a polymethyl (meth) acrylate; a styrene resin such as a polystyrene or a styrene/acrylonitrile copolymer; a polycarbonate resin; a polyester resin; a phenoxy resin; a butyral resin; a polyvinyl alcohol; a cellulose type resin such as ethyl cellulose, cellulose acetate or cellulose acetate butyrate; an epoxy resin; a phenol resin; or a silicone resin, may, for example, be mentioned. Further, it is possible to use an inorganic material, for example, a solution obtained by hydrolytic polymerization of a solution containing a metal alkoxide, a ceramic precursor polymer or a metal alkoxide by a sol-gel method, or an inorganic material having such a combination solidified, e.g. an inorganic material having a siloxane bond or glass.

<Electric Circuit Construction of LED Light Emitting Device>

Figure 7:
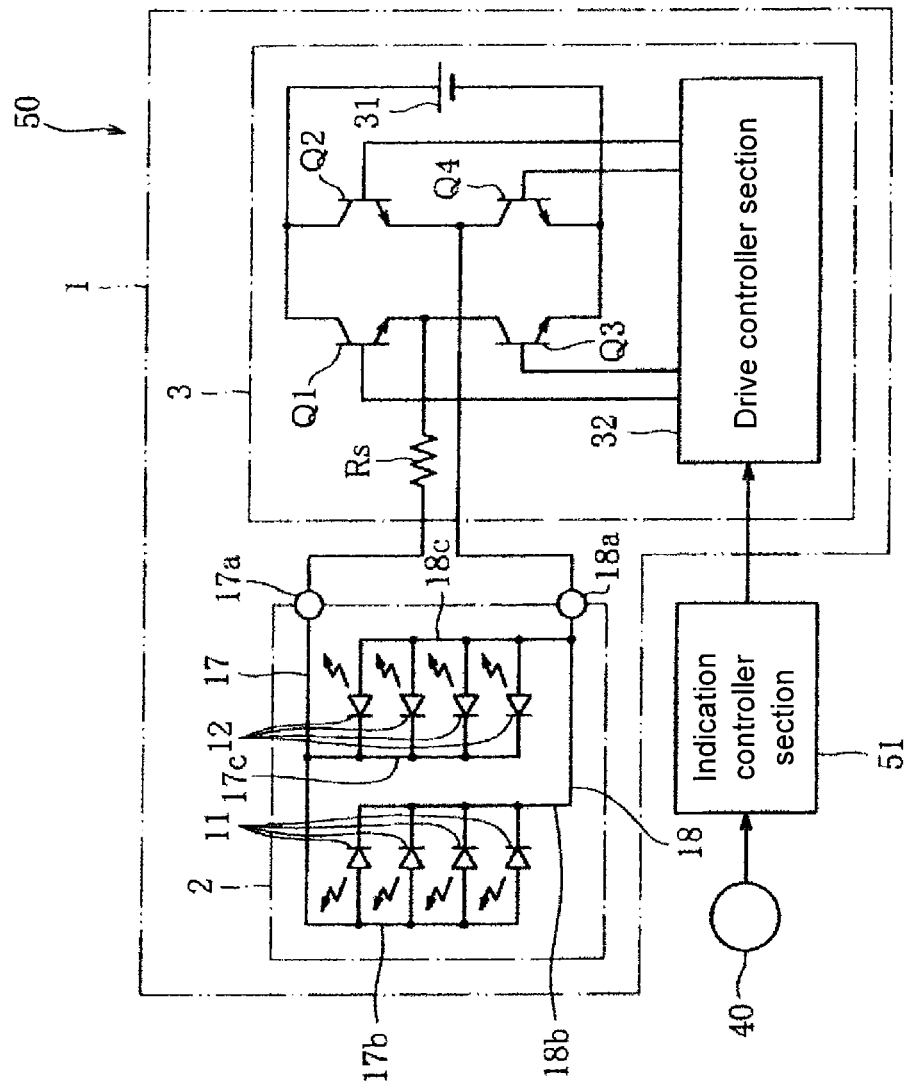
FIG. 7 is an electrical diagram schematically illustrating an electric circuit construction of an LED light emitting device, as an example wherein the LED light emitting device is used for an indicator.

FIG. 7 is an electrical diagram schematically illustrating an electric circuit construction of an LED light emitting device in this embodiment. As mentioned above, the LED light emitting device 1 comprises the light emitting module 2 and a drive unit 3 to be used in combination with this light emitting module 2. The drive unit 3 is provided to adjust the drive currents to be supplied to the first and second semiconductor light emitting elements 11 and 12 and comprises a drive circuit to adjust the drive current to be supplied to the emission module 2 from a drive power source 31 and a drive controller section (drive controller unit) 32 to control the operation of this drive circuit.

Further, in this embodiment, an LED light emitting device 1 is used as a light source for an indicator 50 which is provided for an operation member 40 to set a physical quantity to determine the operation state of an electronic device. That is, depending upon the degree of the physical quantity set by the operation member 40, indication is carried out by the indicator 50 using the LED light emitting device 1 as the light source. A specific example of the electronic device may, for example, be an air conditioner, a fan device or a household cooking device. For example, in the case of an air conditioner, an operation dial to set the temperature or an operation dial to adjust the amount of air corresponds to the operation member 40. Further, in the case of a fan device, an operation dial to adjust the amount of air or to adjust the speed corresponds to the operation member 40. Further, in the case of a household cooking device, an operation dial to adjust the heating power or to set the temperature corresponds to the operation member 40. Here, the electronic device to which the indicator 50 is applicable, and its operation member, are not limited thereto, and in various electronic devices, the indicator 50 may be applied to operation members to set physical quantities to determine their operation states.

(Electric Circuit Construction of Emission Module)

As mentioned above, in the emission module 2, four first semiconductor light emitting elements 11 and four second semiconductor light emitting elements 12 are mounted on the circuit board 10 to constitute an electric circuit. In FIG. 7, the electric circuit construction of the emission module 2 is shown to correspond with practical disposition of the first and second semiconductor light emitting elements 11 and 12 on the circuit board 10.

As shown in FIG. 7, between the first semiconductor light emitting element-mounting portion 17b of the wiring pattern 17 formed on the circuit board 10 and the first semiconductor light emitting element-mounting portion 18b of the wiring pattern 18 formed likewise on the circuit board 10, four first semiconductor light emitting elements 11 are connected in parallel with one another with the respective anodes being on the first semiconductor light emitting element-mounting portion 17b side. Further, between the second semiconductor light emitting element-mounting portion 17c of the wiring pattern 17 and the second semiconductor light emitting element-mounting portion 18c of the wiring pattern 18, four second semiconductor light emitting elements 12 are connected in parallel to one another with the respective anodes being on the second semiconductor light emitting element-mounting portion 18c side. Further, at one end of the wiring pattern 17 and at one end of the wiring pattern 18, a connection terminal 17a and a connection terminal 18a for external connection are, respectively, formed.

(Electric Circuit Construction of Drive Unit)

As shown in FIG. 7, the drive unit 3 has a full bridge type drive circuit constituted by four transistors Q1, Q2, Q3 and Q4, and collectors of transistors Q1 and Q2 are connected to a positive electrode of a drive power source 31, and at the same time, emitters of transistors Q3 and Q4 are connected to a negative electrode of the drive power source 31. On the other hand, a connecting portion between the emitter of transistor Q1 and the collector of transistor Q3, which constitutes one output side of the drive circuit, is connected to the connection terminal 17a formed on the circuit board 10 of the emission module 2, via a resistance Rs for adjusting the current. Further, a connecting portion between the emitter of transistor Q2 and the collector of transistor Q4, which constitutes the other output side of the drive circuit, is connected to the connection terminal 18a formed on the circuit board 10 of the emission module 2. Here, the resistance Rs is provided to adjust the drive currents supplied to the first and second semiconductor light emitting elements 11 and 12, respectively, to a proper level (for example, 60 mA per one semiconductor light emitting element).

Each of four transistors Q1 to Q4 is switchable between the on-state and the off-state in response to each base signal, and each base is connected to the drive controller unit 32 to control such switching. The drive controller unit 32 outputs the respective base signals so that transistors Q1 and Q4 are made to be in the on-state in synchronization while transistors Q2 and Q3 are both in the off-state, and on the other hand, transistors Q2 and Q3 are made to be in the on-state in synchronization while transistors Q1 and Q4 are both in the off-state.

And, when the transistors Q1 and Q4 are both in the on-state, the positive electrode of the drive powder source 31 is connected to the connection terminal 17a via the transistor Q1 and the resistance Rs, and at the same time, the negative electrode of the drive power source 31 is connected to the connection terminal 18a via the transistor Q4. Accordingly, in such a case, only in the first semiconductor light emitting elements 11, the forward current flow, and only the first semiconductor light emitting elements 11 will emit near ultraviolet light. The near ultraviolet light emitted from the first semiconductor light emitting elements 11 is subjected to wavelength conversion by the first phosphor 23 dispersed and held by the first phosphor member 21 disposed in the first region 15 in the reflector 13 like the first semiconductor light emitting elements 11, whereupon a cyan color light is radiated from the first phosphor member 21.

On the other hand, when the transistors Q2 and Q3 are both made to be in the on-state, the positive electrode of the drive powder source 31 is connected to the connection terminal 18a via the transistor Q2, and at the same time, the negative electrode of the drive power source 31 is connected to the connection terminal 17a via the transistor Q3 and the resistance Rs. Accordingly, in such a case, only in the second semiconductor light emitting elements 12, the forward current flows, and only the second semiconductor light emitting elements 12 emit near ultraviolet light. The near ultraviolet light emitted from the second semiconductor light emitting elements 12 is subjected to wavelength change by the second phosphor 25 dispersed and held by the second phosphor member 22 disposed in the second region 16 in the reflector 13 like the second semiconductor light emitting elements 12, whereupon a red color light is radiated from the second phosphor member 22.

Thus, a drive unit 3 is constructed so that it is capable of independently controlling the first drive current to be supplied to the first semiconductor light emitting elements 11 and the second drive current to be supplied to the second semiconductor light emitting elements 12. And, by alternately switching the on-state of the transistors Q1 and Q4 and the on-state of the transistors Q2 and Q3, a combined light of the cyan color light from the first phosphor member 21 and the red color light from the second phosphor member 22 is emitted from the emission module 2 i.e. the LED light emitting device 1. Further, if the supply of the second drive current sufficient for light emission is stopped to the second semiconductor light emitting elements 12 while the first drive current sufficient for light emission is supplied to the first semiconductor light emitting element 11, a cyan color light will be radiated from the emission module 2, and if the supply of the first drive current sufficient for light emission is stopped to the first semiconductor light emitting elements 11 while the second drive current sufficient for light emission is supplied to the second semiconductor light emitting elements 12, a red color light will be radiated from the LED light emitting device 11.

Figure 8:
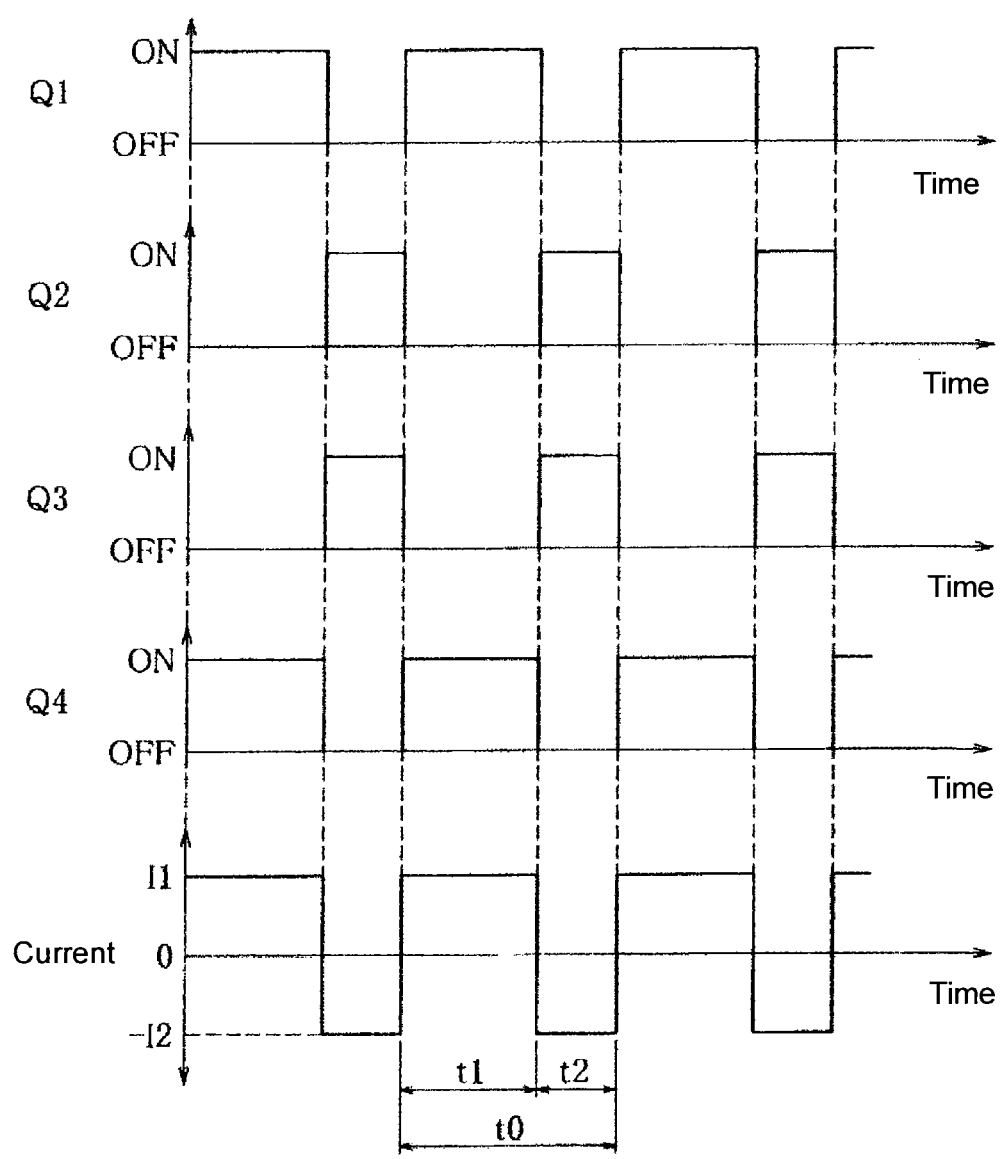
FIG. 8 is a time chart showing an example of the operation state of each transistor and the drive current for each semiconductor light emitting element in the electric circuit construction.

FIG. 8 is a time chart showing an example of the above-described operation state of each of transistors Q1 to Q4 and the drive current for each semiconductor light emitting element. Here, in FIG. 8, the current flowing to the resistance Rs is shown as a current flowing to the four first semiconductor light emitting elements 11 and as a current flowing to the four second semiconductor light emitting elements 12, and accordingly, the total current 11 flowing to the first semiconductor light emitting elements 11 is represented by a positive value, and the total current 12 flowing to the second semiconductor light emitting elements 12 is represented by a negative value as −12.

As shown in FIG. 8, when the transistors Q1 and Q4 both become to be in the on-state, a total current I1 will flow to the four first semiconductor light emitting elements 11, whereby the first semiconductor light emitting elements 11 will emit near ultraviolet light. On the other hand, when the transistors Q2 and Q3 both become to be in the on-state, a total current I2 will flow to the four second semiconductor light emitting elements 12, whereby the second semiconductor light emitting elements 12 will emit near ultraviolet light. Such switching of the on-states is carried out with a period t0 (e.g. 20 ms) whereby flickering of the light radiated from the LED light emitting device 1 accompanying the switching of the emission does not become annoying, and in the example shown in FIG. 8, the on-period t1 of the transistors Q1 and Q4 is set to be longer than the on-period t2 of the transistors Q2 and Q3 (e.g. t1=14 ms, and t2=6 ms).

In a case where the on-state of transistors Q1 and Q4 and the on-state of transistors Q2 and Q3 are alternately switched as described above, the first drive current Id1 per one first semiconductor light emitting element 11 and the second drive current Id2 per one second semiconductor light emitting element 12, are represented by the following formulae (3) and (4).

$$Id1=(t1/t0)\cdot(I1/4) \quad (3)$$

$$Id2=(t2/t0)\cdot(I2/4) \quad (4)$$

Therefore, depending upon the change in the ratio for the on-period t1 of transistors Q1 and Q4 to the on-period t2 of transistors Q2 and Q3, the ratio of the first drive current Id1 to the second drive current Id2 will change. That is, by changing the ratio of these on-periods t1 and t2, the chromaticity point of the light radiated from the LED light emitting device 1 moves on a straight line connecting chromaticity point Pc of the cyan color light radiated from the first phosphor member 21 and chromaticity point Pr of the red color light radiated from the second phosphor member 22, between these chromaticity points Pc and Pr, in the chromaticity diagram in FIG. 6. Thus, by a simple drive circuit construction in the drive controller 3, it is possible to change the chromaticity of the light radiated from the LED light emitting device 1.

Specifically, as the on-period t1 increases, the on-period t2 is reduced, and when the second drive current Id2 is reduced to the second lower limit current value preliminarily set as a current value at which the second semiconductor light emitting elements 12 will no longer emit lights (e.g. t2/t0 being about 0.1), the first drive current Id1 of the first upper limit current value is supplied to the first semiconductor light emitting elements 11, whereupon a cyan color light is radiated from the LED light emitting device 1. On the other hand, inversely, as the on-period t2 increases, the on-period t1 is reduced, and when the first drive current Id1 decreases to the first lower limit current value preliminarily set as a current value at which the first semiconductor light emitting elements 11 will no longer emit light (e.g. t1/t0 being about 0.1), the second drive current Id2 of the second upper limit current value is supplied to the second semiconductor light emitting elements 12, whereupon a red color light is radiated from the LED light emitting device 1. And, in a case where the on-period t1 and the on-period t2 are adjusted so that the first drive current Id1 and the second drive current Id2 become larger than the first and second lower limit current values, respectively, and the first and second semiconductor light emitting elements 11 and 12 emit lights, respectively, a light having a cyan color light and a red color light combined, will be radiated from the LED light emitting device 1.

As mentioned above, chromaticity point Pc and chromaticity point Pr are in such a relation that in the chromaticity diagram in FIG. 6, they face each other across EEW represented by chromaticity point Pc (x=0.33, y=0.33) within the white light region, and accordingly, the line connecting chromaticity point Pc and chromaticity point Pr passes through the white light region and at the same time, passes through the chromaticity point Pw or the vicinity thereof. Therefore, in a case where the ratio of the first drive current Id1 and the second drive current Id2 is changed to change the color of the light radiated from the LED light emitting device 1 from a cyan color corresponding to chromaticity point Pc to a red color corresponding to chromaticity point Pr, or to change a red color corresponding to chromaticity point Pr to a cyan color corresponding to chromaticity point Pc, in the course of such a change, a white light having a chromaticity point within the white light region will be radiated from the LED light emitting device 1. Further, in a case where the chromaticity of the radiated light is changed in such a manner, the white light radiated in the course of such a change is preferably a daylight color. Specifically, it is preferred to select the first phosphor 23 and the second phosphor 25 as described above, so that a white light is radiated which passes through a chromaticity point at which X is at least 0.32 and at most 0.34, and Y is at least 0.32 and at most 0.34, in the CIE (1931) XYZ color space.

<Construction and Operation of Indicator>

As described above, it is possible to change the chromaticity of the light radiated from a LED light emitting device 1 by changing the ratio of the on-period t1 of transistors Q1 and Q4 and the on-period t2 of transistors Q2 and Q3, in the drive unit 3. Further, by using the LED light emitting device 1 as a light source for indication by an indicator 50, it is possible to carry out an indication corresponding to the degree of physical quantity to be set by the operation member 40, by the change of the chromaticity of radiated light.

To carry out such an indication, the indicator 50 is provided with an indication controller section (indication controller unit) to control the operation of the drive controller section 32. The operation member 40 to set the physical quantity to determine the operation state of an electronic device may, for example, be a dial type or a slide type member, and it is so designed that by changing its rotational position or slide position (hereinafter referred to simply as the position of the operation member 40), the degree of the physical quantity to be set is changed. That is, when the operation member 40 is at the lower limit position, the physical quantity to be set corresponding thereto will also have the lower limit value, and when the operation member 40 is at the upper limit position, the physical quantity to be set corresponding thereto will also have the upper limit value. And, as the position of the operation member 40 approaches from the lower limit position towards the upper limit position, the physical quantity to be set corresponding thereto is also designed to approach from the lower limit value to the upper limit value. Thus, the position of the operation member 40 corresponds to the physical quantity to be set by the operation member 40, and it is so designed that a signal corresponding to the position of the operation member 40 is sent to the indication controller section 51, as one indicating the degree of the physical quantity thereby set.

The indication controller section 51 memorizes a control map wherein the relation between the position of the operation member 40 and t1/t0 i.e. the ratio of the on-period t1 of transistors Q1 and Q4 to the period t0 in the on-off control of the above-described transistors Q1 to Q4, is preliminarily set. And, when the indication controller section 51 receives from the operation member 40 a signal corresponding to its position, by means of the control map, the indication controller section obtains the ratio t1/t0 corresponding to the position of the operation member 40. Once the ratio t1/t0 is set, the on-period t1 of transistors Q1 and Q4 and the on-period t2 of transistors Q2 and Q3 will be set based on the preliminarily set period t0. The indication controller section 51 instructs the drive controller section 32 to carry out the on-off control of transistors Q1 to Q4 by the on-periods t1 and t2 thus set.

The drive controller section 32 carries out the on-off control of transistors Q1 and Q4 based on the on-period t1 instructed from the indication controller section 51 and at the same time, carries out the on-off control of transistors Q2 and Q3 based on the on-period t2. As a result, a cyan color light radiated from the first phosphor member 21 when the transistors Q1 and Q4 become to be in the on-state, and a red color light radiated from the second phosphor member 22 when the transistors Q2 and Q3 become to be in the on-state, are combined, and the combined light is radiated from the LED light emitting device 1 and used as an illumination light for an indication of the indicator 50.

Figure 9:
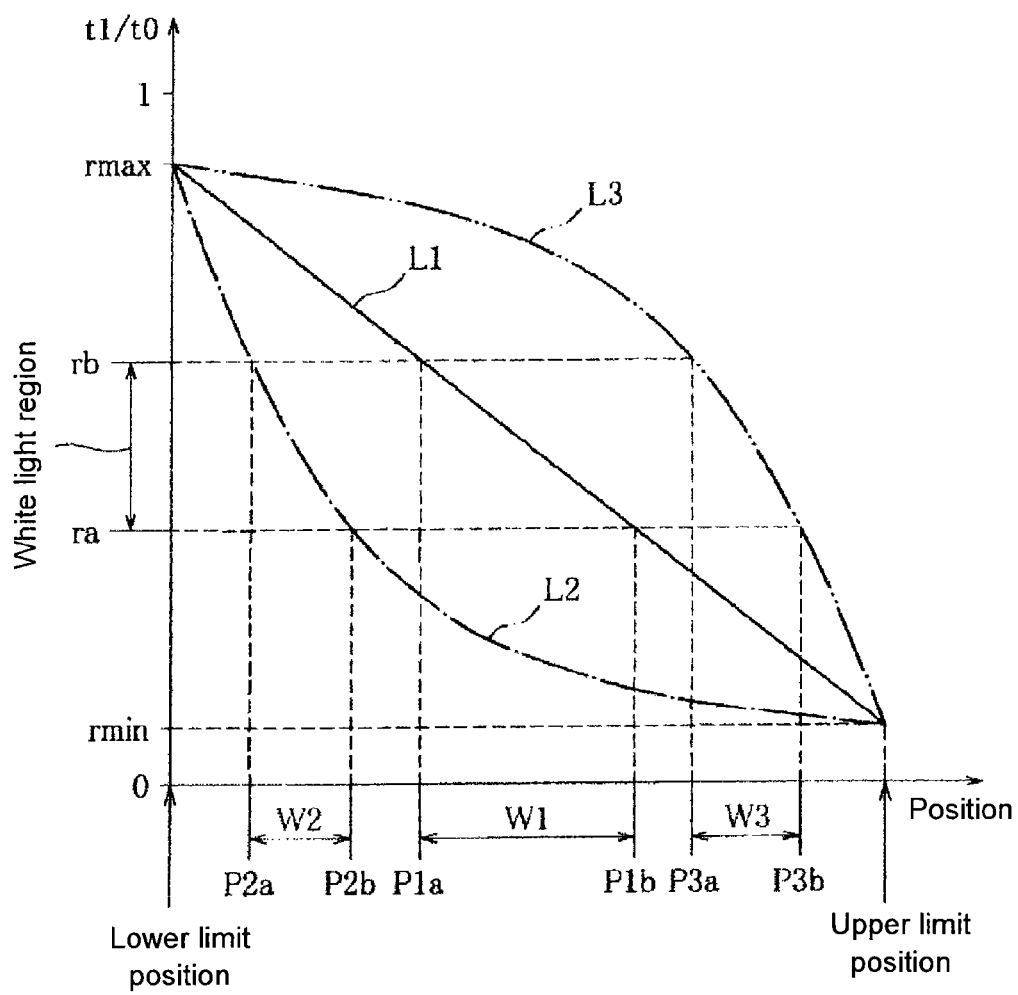
FIG. 9 is a graph to show an example of a control map that is memorized by the indication controller section in the indicator of FIG. 7.

Here, the control map memorized by the indication controller section 51 will be described in detail. As mentioned above, in this control map, the relation between the position of the operation member 40 and the ratio t1/t0 of the on-period t1 to the period t0, is set. FIG. 9 is a graph exemplifying such a relation between the position of the operation member 40 and the ratio t1/t0. In this embodiment, the relation between the two is set by straight line L1 shown by a solid line in FIG. 9. That is, the operation member 40 is capable of changing its position between the preliminarily set lower limit position and upper limit position, and as shown in FIG. 9, when the operation member 40 is at the lower limit position, the ratio t1/t0 becomes rmax corresponding to the first upper limit current value, while when the operation member 40 is at the upper limit position, the ratio t1/t0 becomes rmin corresponding to the first lower limit current value. And, as the position of the operation member 40 approaches from the lower limit position to the upper limit position, the ratio t1/t0 is designed to linearly decrease along the straight line L1.

When the ratio t1/t0 is rmax, as mentioned above, the first drive current with the upper limit current value is supplied to the first semiconductor light emitting elements 11, and the second drive current with the second lower limit current value is supplied to the second semiconductor light emitting elements 12, whereby only a cyan color light from the first phosphor member 21 is used for an indication of the indicator 50. Whereas, when t1/t0 is rmin, as mentioned above, the first drive current with the first lower limit current value is supplied to the first semiconductor light emitting elements 11, and the second drive current with the second upper limit current value is supplied to the second semiconductor light emitting elements 12, whereby only a red color light from the second phosphor member 22 is used for an indication of the indicator 50.

Further, when the operation member 40 is at a position between the lower limit position and the upper limit position, a combined light of the cyan color light radiated from the first phosphor member 21 and the red color light radiated from the second phosphor member 22, is used as an illumination light for an indication of the indicator 50. At that time, as shown in FIG. 9, as the position of the operation member 40 approaches the lower limit position, the ratio t1/t0 approaches rmax, and accordingly, in the indication color of the indicator 50 by the LED light emitting device 1, the cyan color component increases and at the same time, the red color component decreases, whereby the indication color tends to be close to the cyan color. On the other hand, as the position of the operation member 40 approaches the upper limit position, the ratio t1/t0 approaches rmin, and accordingly, in the indication color of the indicator 50 by the LED light emitting device 1, the red color component increases and at the same time, the cyan color component decreases, whereby the indication color tends to be close to the red color.

In this embodiment, it is so designed that when the ratio t1/t0 is within a range of from ra to rb as shown in FIG. 9, the chromaticity point of light radiated from the LED light emitting device 1 in the chromaticity diagram in FIG. 6 is located in the white light region defined in the chromaticity diagram in FIG. 6. As described above, the indication color of the indicator 50 by the LED light emitting device changes depending upon the position of the operation member 40, however, in this embodiment, the position of the operation member 40 and the ratio t1/t0 are in a relation represented by straight line L1 in FIG. 9, whereby when the position of the operation member 40 is within a region W1 from position P1a to position P1b being an intermediate region in the changeable range, the position of the chromaticity point of light radiated from the LED light emitting device 1 in the chromaticity diagram in FIG. 6 becomes within the white light region set in the same Fig.

Accordingly, for example, if the position of the operation member 40 is changed from the lower limit position to the upper limit position, the indication color of the indicator 50 by the LED light emitting device 1 changes from the cyan color corresponding to the lower limit position of the operation member 40 to a combined color, wherein the cyan color component gradually decreases and at the same time, the red color component increases, as the position becomes close to position P1a, and when the operation member 40 is in a region from position P1a to position P1b, the indication color becomes a white color. And, thereafter, as the position of the operation member 40 approaches from position P1b to the upper limit position, the indication color changes to a combined color wherein the cyan color component further decreases and at the same time, the red component increases, and when the position of the operation member 40 reaches the upper limit position, the indication color becomes a red color.

Thus, in this embodiment, as between the case where the operation member 40 is at the lower limit position and the case where it is at the upper limit position, the indication colors of the indicator 50 by the LED light emitting device become to be in a complementary color relation to each other, whereby it is possible to clearly tell at which position the operation member 40 is located as between the lower limit position and the upper limit position. The position of the operation member 40 corresponds to the degree of the physical quantity to be set by the operation member 40, and when the operation member 40 is at the lower limit position, the physical quantity to be set corresponding thereto will also take the lower limit value, and when the operation member 40 is at the upper limit position, the physical quantity to be set corresponding thereto will also take the upper limit value, whereby it is possible to clearly tell at which side the physical quantity to be set by the operation member 40 takes as between the upper limit value and the lower limit value.

Furthermore, in an intermediate region in the changeable range of the position of the operation member 40, the indication color of the indicator 50 by the LED light emitting device 1 becomes a highly distinguishable white color against both the cyan color corresponding to the lower limit position and the red color corresponding to the upper limit position, whereby it is possible to realize an indication of the indicator 50 accompanied by a clear change of the indication color over the entire region in the changeable range of the position of the operation member 40.

Further, as mentioned above, in the intermediate region in the changeable range of the position of the operation member 40, the indication color of the indicator 50 by the LED light emitting device 1 becomes a white color, whereby it is possible to clearly tell that the degree of the physical quantity to be set by the operation member 40 is in the intermediate region within the range of the physical quantity that can be set by the operation member 40. Particularly in the case of this embodiment, the chromaticity of white light radiated from the indicator 50 at that time passes through the chromaticity point at which X becomes at least 0.32 and at most 0.34, and Y becomes at least 0.32 and at most 0.34 in the CIE (1931) XYZ color space. The white light at such a chromaticity point has a daylight color, whereby the distinguishability becomes better.

Here, in this embodiment, the first phosphor 23 and the second phosphor 25 are used which respectively radiate a cyan color light and a red color light being in a complementary color relation to each other, but as mentioned above, even when two types of phosphors whereby two types of radiation lights being in a complementary color relation to each other are obtainable, are employed as the first phosphor 23 and the second phosphor 25, it is possible to likewise obtain the effects as described above.

Further, the colors of lights radiated from the first and second phosphors 23 and 25 may not be in a complementary color relation to each other. That is, as mentioned above, as the first and second phosphors 23 and 25, two types of phosphors may be employed such that in the chromaticity diagram in FIG. 6, the chromaticity of the radiation light of each of them is located outside of the white light region and at the same time, the chromaticity of radiation light of one of them and the chromaticity of radiation light of the other are located on the opposite sides each other to the blackbody radiation locus BBL. A specific method for such selection is as described above.

In such a case, since the white light region is set to be a region where the absolute value of the deviation duv from the blackbody radiation locus is at most 0.02 in the CIE (1976) L*u*v* color space chromaticity diagram, the color difference between lights radiated from the two types of phosphors to be thus employed becomes larger than 0.04 in the CIE (1976) L*u*v* color space chromaticity diagram. Accordingly, by controlling the drive currents of the first and second semiconductor light emitting elements 11 and 12, the chromaticity of a combined light obtainable by combining the respective lights radiated from the first and second phosphor members 21 and 22 as described above, changes within the changeable range of chromaticity where the color difference becomes larger than 0.04 in the CIE (1976) L*u*v* color space chromaticity diagram. Therefore, also in this case, it is possible to secure good distinguishability between a case where only the radiation light of the first phosphor member 21 is radiated from the LED light emitting device 1 and a case where only the radiation light of the second phosphor member 22 is radiated from the LED light emitting device 1, depending upon the position of the operation member 40.

Furthermore, the two types of phosphors to be employed as described above are in such a relation that in the chromaticity diagram in FIG. 6, the chromaticity of one radiation light and the chromaticity of the other radiation light are located on the opposite sides to one another to the blackbody radiation locus BBL, whereby like in this embodiment, in an intermediate region within the changeable range of chromaticity of the combined light obtained by combining the respective radiation lights of the first and second phosphor members 21 and 22, a white light is obtainable as a combined light so that it has a chromaticity point in the white light region. Thus, also by the LED light emitting device 1 in this case, it is possible to realize an indication of the indicator 50 accompanied with a clear change of the indication color over the entire region within the changeable range of the position of the operation member 40 and at the same time, it is possible to clearly tell that the degree of the physical quantity to be set by the operation member 40 is in an intermediate region within the range of the physical quantity which can be set by the operation member 40.

The positional range of the operation member 40 wherein the indication color of the indicator 50 by the LED light emitting device 1 becomes a white color, may be suitably adjusted depending upon not only the type, characteristics, etc. of the physical quantity to be set by the operation member 40 but also various elements, the type, characteristics, purposes, etc. of an electronic device in which the operation member 40 is provided. For example, in a case where it is desired to set the indication color of the indicator 50 by the LED light emitting device 1 to be a white color within a positional range closer to the lower limit position as compared with this embodiment, the position of the operation member 40 and the ratio t1/t0 may be set, for example, in such a relation that they change along curve L2 shown by a dashed dotted line in FIG. 9. In this case, as shown in FIG. 9, when the position of the operation member 40 is within a region W2 from position P2a to position P2b, the indication color of the indicator 50 becomes white, and the white light region becomes closer to the lower limit position side than the above described region W1 of this embodiment. On the other hand, in a case where it is desired to set the indication color of the indicator 50 by the LED light emitting device 1 to be a white color within a positional range closer to the upper limit position as compared with this embodiment, the position of the operation member 40 and the ratio t1/t0 may be set, for example, in such a relation that they change along curved line L3 shown by a dashed-two dotted line in FIG. 9. In this case, as shown in FIG. 9, when the position of the operation member 40 is in region W3 from position P3a to position P3b, the indication color of the indicator 50 becomes white, and the white light region becomes closer to the upper limit position side than the above-described region W1 of this embodiment.

The relation between the position of the operation member 40 and the ratio t1/t0 in the control map, is not limited only to the above-described one, and the optimum relation may be set as the case requires, and it may be set so that the ratio t1/t0 changes depending upon the change in the position of the operation member 40. Further, in the above embodiment, the control map is set for such a relation that as the position of the operation member 40 approaches from the lower limit position to the upper limit position, the ratio t1/t0 decreases, but the control map may be set for an inversed relation depending upon the radiation colors of the phosphors to be used for the objective physical quantity. Further, instead of the ratio t1/t0, the ratio t2/t0 may be set, or at least one of period t1 and period t2 may be directly set depending upon the position of the operation member 40.

<Example for Application to Indicator>

The LED light-emitting device of the present invention is applicable in various forms as a light source for indication of an indicator. A few application examples will be described below.

APPLICATION EXAMPLE 1

Figure 10:
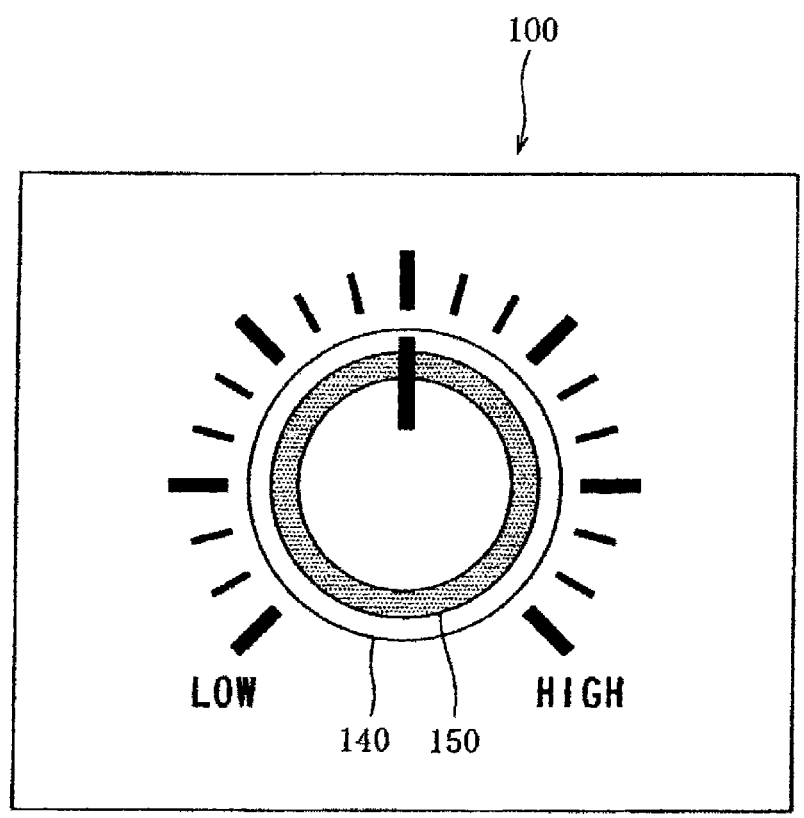
FIG. 10 is a configuration diagram schematically showing an example wherein the LED light emitting device is applied to an indicator of a temperature setting dial of an air conditioner for a vehicle.

FIG. 10 is a configuration diagram schematically showing Application Example 1 wherein the LED light emitting device 1 of the present invention is applied to an indicator 150 of a temperature-setting dial (operation member) 140 for an air conditioner (electronic device) 100 to be used for e.g. a vehicle. The temperature-setting dial 140 is rotatable in a range from the lower limit position shown by the indication "LOW" to the upper limit position shown by the indication "HIGH". On the top surface of the temperature-setting dial 140, an indicator 150 formed in a ring shape is provided, and for illumination of this indicator 150, radiation light of the LED light emitting device 1 of the present invention is used. That is, the temperature-setting dial 140 corresponds to the operation member 40 in the above-described embodiment, and the indicator 150 corresponds to the indicator 50. Accordingly, in this application example, the physical quantity to be set by using the temperature-setting dial 140 is the preset temperature of the air conditioner 100. And, when the temperature-setting dial 140 is at the lower limit position, the lower limit temperature within the preliminarily set temperature range becomes a preset temperature, while when the temperature-setting dial 140 is at the upper limit position, the upper limit temperature in the preset temperature range becomes a preset temperature.

The change of the indication color of the indicator 150 by the LED light emitting device 1 corresponding to the change in the position of the temperature-setting dial 140 is carried out in the same manner as the above-described embodiment. Therefore, in a case where the temperature-setting dial 140 is at the lower limit position shown by the indication "LOW", the indication color of the indicator 150 by the LED light emitting device 1 becomes a cyan color. The preset temperature of the air conditioner 100 to be set at that time becomes the lower limit temperature within the preliminarily set temperature range, whereby indication is carried out by an indication color which is sensuously well matched with the preset temperature. On the other hand, in a case where the temperature-setting dial 140 is at the upper limit position shown by the indication "HIGH", the indication color of the indicator 150 by the LED light emitting device 1 becomes a red color. The preset temperature of the air conditioner 100 to be set at that time becomes the upper limit temperature within the preliminarily set temperature range, whereby also in this case, indication is carried out by an indication color which is sensuously well matched with the preset temperature.

Further, when, for example, the temperature-setting dial 140 is changed from the lower limit position to the upper limit position, the indication color of the indicator 150 by the LED light emitting device 1 changes from the cyan color corresponding to the lower limit position to a combined color wherein the cyan color component gradually decreases and at the same time, the red component increases, and finally becomes a white color. And, if the temperature-setting dial 140 is further brought to be close to the upper limit position, the indication color changes from the white color to a combined color wherein the cyan color component further decreases and at the same time, the red color component increases, and when the position of the temperature-setting dial 140 reaches the upper limit position, the indication color becomes a red color. Therefore, in a case where a temperature in an intermediate region within the temperature setting range capable of being set by the temperature-setting dial 140, is set, the indication color of the indicator 150 becomes a white color, whereby it is possible to clearly tell that the preset temperature by the temperature-setting dial 140 is an intermediate temperature.

Further, as described above, it is possible to adjust the positional range of the temperature-setting dial 140 wherein the indication color of the indicator 150 by the LED light emitting device 1 becomes a white color, and accordingly, it is possible to adjust the positional range of the temperature-setting dial 140 wherein the indication color of the indicator 150 becomes a white color, depending upon the temperature range capable of being set by the temperature-setting dial 140, so that such a positional range is suitable for the user.

In this application example, the LED light emitting device 1 is applied to an indicator 150 of a temperature-setting dial 140, but it may be applied to an indicator of e.g. an air volume-adjusting dial or an air flow direction-adjusting dial of an air conditioner 100. Further, the shape or location of the indicator 150 is not limited to one employed in this application example and may variously be changed as the case requires.

APPLICATION EXAMPLE 2

In the foregoing embodiment and Application Example 1, it is so designed that the indication controller section 51 controls the drive controller section 32 depending upon the position of the operation member 40 or the temperature-setting dial 140, however, it may be designed so that the indication color of the indicator is changed depending upon the degree of the physical quantity which is variously changed depending upon e.g. surroundings instead of the physical quantity to be artificially set by e.g. the operation member 40 or the temperature-setting dial 140. In such a case, a sensor (not shown) to detect the objective physical quantity, is used instead of the operation member 40 or the temperature-setting dial 140. An example for application to such an indicator will be described below as Application Example 2.

Figure 11:
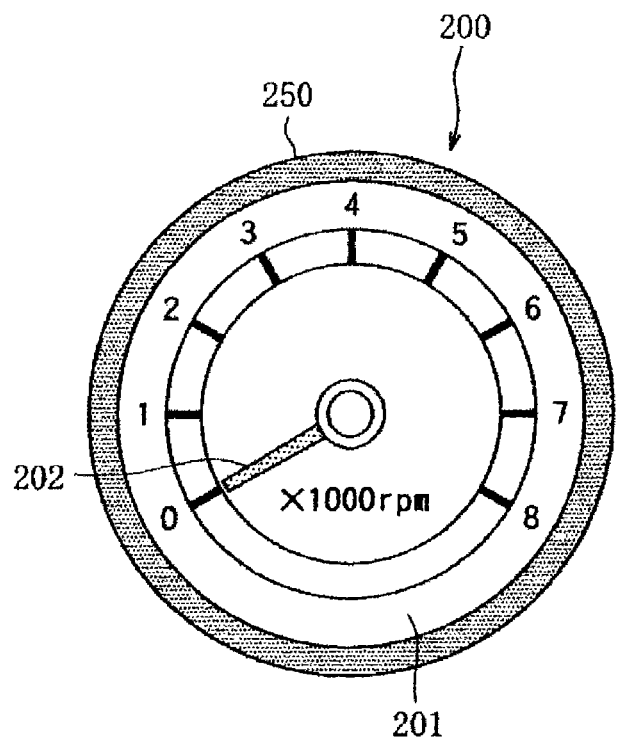
FIG. 11 is a configuration diagram schematically showing an example wherein the LED light emitting device is applied to an indicator of a tachometer device for a vehicle.

FIG. 11 is a configuration diagram schematically showing an example wherein the LED light emitting device 1 of the present invention is applied to an indicator 250 of a tachometer device 200 for a vehicle. The tachometer device 200 comprises a dial 201 provided with a rotational speed scale, and an indicator needle 202 to indicate an engine speed (operation state quantity). Further, on the tachometer device 200, a ring-shaped indicator 250 is provided to surround the periphery of the dial 201, and for illumination of this indicator 250, radiation light of the LED light emitting device 1 of the present invention is used. That is, in this application example, a detection signal of a rotational speed sensor (not shown) to detect the engine speed is input to an indication controller section 51 instead of a signal corresponding to the position of the operation member 40. Thus, the engine speed detected by the rotational speed sensor is the objective physical quantity, and the indicator 250 corresponds to the indicator 50 in the above-described embodiment. And, the lower limit value in the changeable range preliminarily estimated as the engine speed is 0 rpm, and the upper limit value is the upper limit rotation speed to be determined by e.g. the specification of the engine or the vehicle.

In this application example, the engine speed is employed instead of the position of the operation member 40 or the temperature-setting dial 140, and in the same manner as in the above-described embodiment, the change of the indication color of the indicator 250 by the LED light emitting element 1 corresponding to the change in the engine speed, is carried out. Therefore, in a case where the engine speed is at the lower limit value of 0 rpm i.e. in a case where the engine is stopped, the indication color of the indicator 250 by the LED light emitting device 1 becomes a cyan color. Thus, indication is carried out by an indication color which is sensuously well matched with the stopped engine. On the other hand, when the engine speed has increased to the upper limit rotational speed, the indication color of the indicator 250 by the LED light emitting device 1 becomes a red color. Thus, also in this case, indication is carried out by an indication color which is sensuously well matched with the preset speed.

Further, for example, in a case where the engine is started, and the engine speed is gradually increased, the indication color of the indicator 250 by the LED light emitting device 1 changes from a cyan color when the engine is stopped to a combined color wherein the cyan color component gradually decreases and at the same time, the red color component increases, and eventually becomes white color, and when the engine speed in further increased, the indication color changes from the white color to a combined color wherein the cyan color component further decreases and at the same time, the red color component increases, and when the engine speed reaches the upper limit rotational speed, the indication color of the indicator 250 becomes a red color. Thus, in the case of an engine speed in an intermediate region within the preliminarily estimated changeable range for the engine speed, the indication color of the indicator 250 becomes a white color, and it is possible to clearly tell that the engine speed is at an intermediate rotational speed.

Further, as mentioned above, it is possible to adjust the range of the engine speed wherein the indication color of the indicator 250 by the LED light emitting device 1 becomes a white color, and accordingly, it is possible to adjust the range of the engine speed wherein the indication color of the indicator 250 becomes a white color, depending upon a preliminarily estimated changeable range of the engine speed or upon the range of the engine speed to be indicated as an intermediate region of the engine speed.

Further, it may be so designed that when the engine is stopped, no indication by the indicator 250 is carried out, and only when the engine is in operation, indication by the indicator 250 is carried out. In such a case, the preliminarily estimated changeable range of the engine speed is from an idling rotational speed to the upper limit rotational speed, and the idling rotational speed after initiation of engine operation is the lower limit rotational speed, and when the engine is in an idling operation state, the indication color of the indicator 250 by the LED light emitting device 1 becomes a cyan color.

Further, in this application example, the indication color of the indicator formed around the tachometer device 200 is made to be changed by the radiation color of the LED light emitting device 1, however, in place thereof or in combination therewith, it may be so designed that the radiation light of the LED light emitting device 1 is led to the indicator needle 202 of the tachometer device 200, and the color of the indicator needle 202 is changed depending upon the engine speed. Further, the shape or location of the indicator 250 is not limited to one shown in this application example and may be variously changed as the case requires.

In this application example, the LED light emitting device 1 is applied to the indicator 250 of the tachometer device 200 for a vehicle, however, it may be applied to an indicator of various meter devices, such as a speed meter for a vehicle, or it is possible to apply the LED light emitting device 1 of the present invention as a light source for an indicator or character for a digital meter other than the analog meter as in this application example. Further, it may be applied in the same manner to an indicator of other than a meter device so long as the indicator is to indicate the degree of a physical quantity which changes depending upon its surroundings, and it may be applied in the same manner also to other than a vehicle.

<Example for Modification of LED>

In the above-described embodiment, the first LED is constituted by a plurality of first semiconductor light emitting elements 11 mounted and aligned on the circuit board 10 and the first phosphor member 21 provided to cover these first semiconductor light emitting elements 11, and the second LED is likewise constituted by a plurality of second semiconductor light emitting elements 12 mounted and aligned on the circuit board 10 and the second phosphor member 22 provided to cover these second semiconductor light emitting elements 12. However, the first and second LEDs are not limited to such a construction, and various constructions may be employed without departing from the concept of the present invention. In the following, one of such modification examples will be described.

Figure 12:
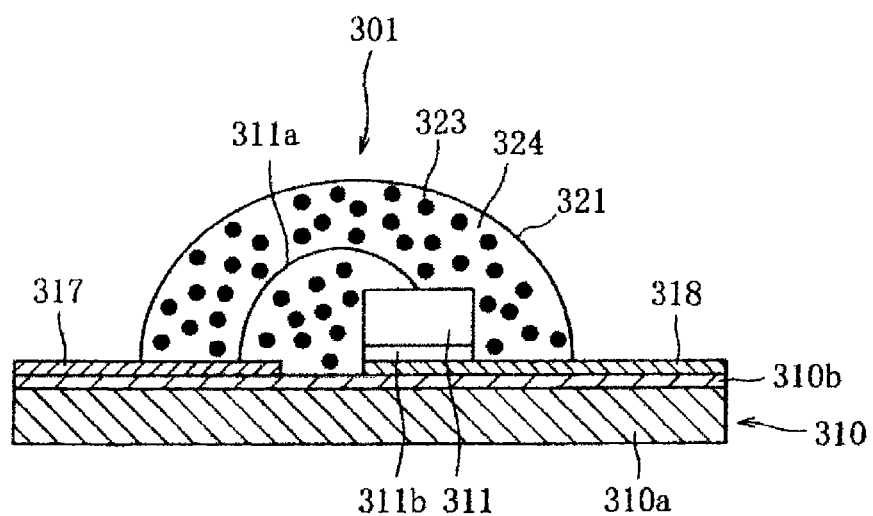
FIG. 12 is a cross-sectional view schematically illustrating a modification example of the first LED in the LED light emitting device.

FIG. 12 is a cross-sectional view schematically illustrating first LED 301 as one of such modification examples. Here, second LED 302 not shown in FIG. 12 is also constructed in the same manner as the first LED 301 except that only the phosphor member to be used is different from the first LED 301, as described later. Therefore, in the following, this modification example will be described primarily with reference to the first LED 301, and as the case requires, also the second LED 302 will be described with reference to the first LED 301 shown in FIG. 12.

As shown in FIG. 12, also in this modification example, a first semiconductor light emitting element 311 is mounted on a circuit board 310. However, in this modification example, a metal board excellent in heat dissipation properties is used as the board main body 310a for the circuit board 310. As the metal board, it is preferred to use one excellent in heat dissipation properties, such as an aluminum board or a copper board. Among them, an aluminum board is preferred from the viewpoint of light weight and heat dissipation properties. And, since such a metal board main body 310a is used, an electrically insulating layer 310d is interposed to form wiring patterns 317 and 318 on the surface of the circuit board 310 for mounting the first semiconductor light emitting element 311. The material for the board main body 310a is not limited to such a metal board, and in the same manner as in the above-described embodiment, a material having an electric insulating property such as an alumina-type ceramics excellent in electrical insulating properties and having good heat dissipation properties, may be employed.

Like in the above-described embodiment, the first semiconductor light emitting element 311 may be a LED chip to emit near ultraviolet light having a peak wavelength of 405 nm, and for example, a GaN type LED chip which employs an InGaN semiconductor as a light emitting layer and which emits light in a near ultraviolet region, is employed. However, the type or emission wavelength property of the first semiconductor light emitting element 311 is not limited thereto, and various LED chips may be employed without departing from the concept of the present invention. In this modified example, the peak wavelength of light emitted from the first semiconductor light emitting element 311 is preferably within a wavelength range of from 360 nm to 420 nm, more preferably within a wavelength range of from 390 nm to 415 nm.

The first semiconductor light emitting element 311 has one of two electrodes (e.g. p electrode) to supply a drive current on its upper surface and the other (e.g. n electrode) on its lower surface, and the electrode on the upper surface is connected to the wiring pattern 317 by a metal wire 311a, and at the same time, the electrode on the lower surface is directly connected to a wiring pattern 318 by means of eutectic solder. Here, a method for mounting the first semiconductor light emitting element 311 on the circuit board 310 is not limited to such a method, and it is possible to select a proper method depending upon e.g. the positions of electrodes to be formed on the first semiconductor light emitting element 311. For example, it is possible to employ a double wire bonding wherein after bonding and fixing the first semiconductor light emitting element 311 at a prescribed position on the circuit board 310, two electrodes located on the upper surface side of the first semiconductor light emitting element 311 are connected to the wiring patterns 317 and 318 of the circuit board 310 by metal wires, or a flip chip mounting wherein in the same manner as in the above-described embodiment, two electrodes located on the lower surface side of the first semiconductor light emitting element 311 are connected to wiring patterns 317 and 318 via metal bumps.

For each first semiconductor light emitting element 311 thus mounted on the circuit board 310, a first phosphor member (first wavelength conversion member) 321 is provided in the same manner as in the above-described embodiment. The first phosphor member 321 is provided to cover the first semiconductor light emitting element 311 by means of e.g. a dispenser. Also for the second LED 302, a second phosphor member (second wavelength conversion member) is provided to cover the second semiconductor light emitting element in the same manner as for the first LED 301, but as mentioned above, this second phosphor member is different from the first phosphor member 321.

The first phosphor member 321 is constituted in the same manner as the first phosphor member 21 in the above-described embodiment, and a first phosphor 323 to let a part or whole of near ultraviolet light emitted from the first semiconductor light emitting element 311 undergo wavelength conversion to radiate visible light, is dispersed and held in a first filler 324. Further, the second phosphor member is also constituted in the same manner as the second phosphor member 22 in the above-described embodiment, and a second phosphor to let a part or whole of near ultraviolet light emitted from the second semiconductor light emitting element undergo wavelength conversion to radiate visible light, is dispersed and held in a second filler. Selection of the first phosphor 323 and the second phosphor is carried out in the same manner as for selection of the first phosphor 23 and the second phosphor 25 in the above-described embodiment, and therefore, the description with respect to the phosphors to be selected is omitted here.

The first LED 301 and the second LED 302 thus constructed, are combined, and used for an LED light emitting device, whereby a combined light of light emitted from the first LED 301 and light emitted from the second LED 302 can be used as a radiation light of the LED light emitting device. Therefore, by controlling the first drive current to be supplied to the first LED 301 and the second drive current to be supplied to the second LED 302, in the same manner as in the LED light emitting device 1 of the above-described embodiment, it is possible to obtain the same function and effects.

Figure 13:
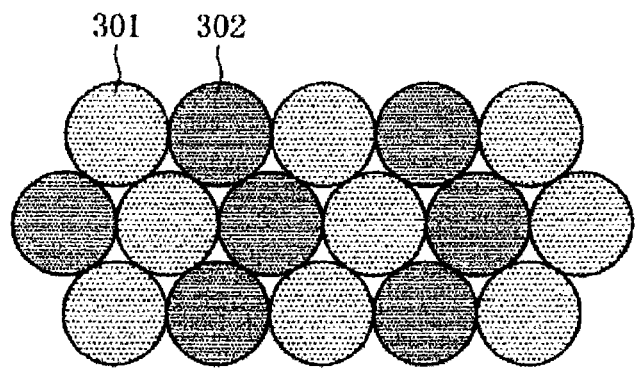
FIG. 13 is a plan view schematically illustrating an example of arrangement of the first and second LEDs, to be used in the modification example of FIG. 12.

Especially, in the case of this modified example, separate phosphor members are, respectively, provided for individual semiconductor light emitting elements, whereby the degree of freedom in layout of the first LED 301 and the second LED 302 increases, and even in a case where there is a restriction with respect to the size, shape, position, etc. of the setting space, it is possible to flexibly accommodate such a restriction and to arrange the respective LEDs with a high density. Especially when the first LEDs 301 and second LEDs 302 are arranged as mixed and dispersed, it is possible to further effectively combine lights emitted respectively from the first LEDs 301 and the second LEDs 302. An example of such dispersed arrangement is shown in FIG. 13. In the example in FIG. 13, as observed in rows in horizontal direction in FIG. 13, first LEDs 301 and second LEDs 302 are alternately arranged, and as between adjacent two rows, the respective LEDs are displaced by a half of the radius of each LED in the direction of the respective rows, and thus, it is so designed that while the first LEDs 301 and the second LEDs 302 are arranged with a high density, it is possible to well combine radiation lights of both. However, arrangement of the first LEDs 301 and the second LEDs 302 is not limited thereto and may be variously changed, as the case requires.

As described above, various types of LEDs may be employed as the first and second LEDs in the LED light emitting device of the present invention. In the above-described embodiment and modification examples, the first and second LEDs are constructed by combining a semiconductor light emitting element which emits near ultraviolet light and a phosphor member to let the near ultraviolet light emitted from the semiconductor light emitting element undergo wavelength conversion to radiate visible light. By taking such a construction, as compared with a case where lights emitted from semiconductor light emitting elements are per se combined and used as a radiation light of an LED light emitting device, it is possible to obtain a radiation light having the emission spectrum width broadened and having better color rendering properties, from the LED light emitting device.

However, in the case of using the LED light emitting device for an indicator, the influence of a decrease in the color rendering properties is less as compared with the case of using it for indoor lighting. Therefore, it is possible to combine lights emitted from semiconductor light emitting elements themselves and use the combined light as the radiation light of the LED light emitting device. That is, by employing two types of semiconductor light emitting elements respectively as the first and second LEDs in such a combination of emission colors as adopted in the above-described embodiment and controlling the drive currents of such first and second LEDs in the same manner as in the above-described embodiment, the radiation color of the LED light emitting device may be changed in the same manner as in the above-described embodiment. In such a case, it becomes possible to construct the LED light emitting device to have a more compact and simple structure. Further, it is also possible to use a semiconductor light emitting element and a phosphor member in combination for either one of the first and second LEDs and use only a semiconductor light emitting element for the other.

Figure 14:
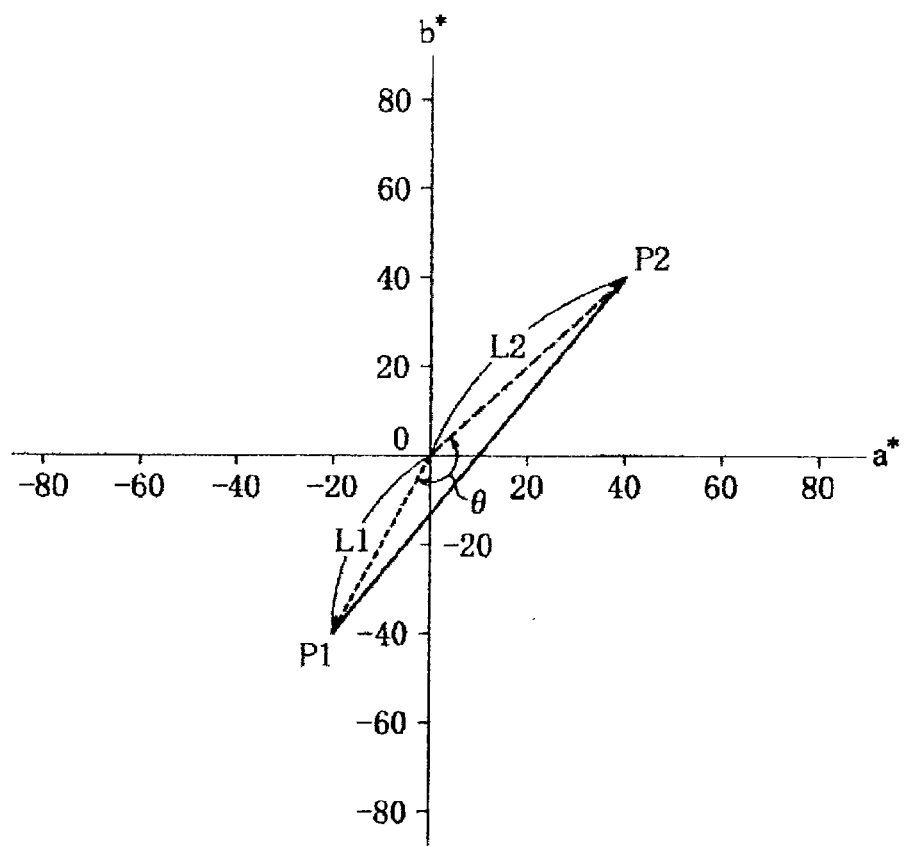
FIG. 14 is a schematic graph to illustrate another modification example of the emission color of the first LED 301 and the emission color of the second LED 302.

FIG. 14 is a graph showing an emission color of first LED 301 and an emission color of second LED 302, as one of other modification examples. In FIG. 14, the emission color of the first LED 301 and the emission color of the second LED 302 are shown on the a*b* coordinate plane in the CIE (1976) L*a*b* color space chromaticity diagram. In the example shown in FIG. 14, the angle θ between a line segment (line segment shown by a dotted line in FIG. 14) that connects the origin and the coordinates (P1 in FIG. 14) representing the emission color of the first LED 301 and a line segment (line segment shown by a dashed line in FIG. 14) that connects the origin and the coordinates (P2 in FIG. 14) representing the emission color of the second LED 302 is an angle of at least 120° and at most 240°. By such a construction, even in a case where the emission color of the first LED 301 and the emission color of the second LED 302 are not strictly in a point symmetrical relation on the a*b* coordinate plane in the CIE (1976) L*a*b* color place chromaticity diagram, a white color is radiated in the course of change (course of change shown by a solid line in FIG. 14) from the emission color of the first LED 301 to the emission color of the second LED 302, and it is possible to realize a distinct change of the emission color. Further, since the emission color of the first LED 301 and the emission color for the second LED 302 are not required to be strictly in a point symmetrical relation on the a*b* coordinate plane in the CIE (1976) L*a*b* color space chromaticity diagram, it is possible to flexibly determine the emission color of the first LED 301 and the emission color of the second LED 302. Further, the angle of angle θ between the line segment that connects the origin and coordinates representing the emission color of the first LED 301 and the line segment that connects the origin and coordinates representing the emission color of the second LED 302 is preferably from 160° to 200°, more preferably from 170° to 190°, most preferably from 180°. Here, as shown in FIG. 14, the angle θ between the line segment that connects the origin and coordinates P1 representing the emission color of the first LED 301 and the line segment that connects the origin and coordinates P2 representing the emission color of the second LED 302 is preferably an angle of at least 120° and at most 240°, but it may be an angle of less than 120° or an angle exceeding 240°.

Further, in the example shown in FIG. 14, the emission color of the first LED 301 and the emission color of the second LED 302 are in such a relation that on the a*b* coordinate plane in the CIE (1976) L*a*b* color space chromaticity diagram, the difference between the length L1 of a line segment that connects the origin and coordinates P1 representing the emission color of the first LED 301 and the length L2 of a line segment that connects the origin and coordinates P2 representing the emission color of the second LED 302, is less than 20. Further, the emission color of the first LED 301 and the emission color of the second LED 302 are in such a relation that on the a*b* coordinate plane in the CIE (1976) L*a*b* color space chromaticity diagram, as between the length L1 that connects the origin and coordinates P1 representing the emission color of the first LED 301 and the length L2 of a line segment that connects the origin and coordinates P2 representing the emission color of the second LED 302, the ratio of one of them to the other and the ratio of the other to said one of them are at most 2.0. By such a construction, a white light can be radiated in an intermediate region in the course of change from the emission color of the first LED 301 to the emission color of the second LED 302. Further, the difference between the length L1 of the line segment that connects the origin and coordinates P1 representing the emission color of the first LED 301 and the length L2 of the line segment that connects the origin and coordinates P2 representing the emission color of the second LED 302, is preferably less than 10, more preferably less than 5. Further, as shown in FIG. 14, the difference between the length L1 of the line segment that connects the origin and coordinates P1 representing the emission color of the first LED 301 and the length L2 of the line segment that connects the origin and coordinates P2 representing the emission color of the second LED 302, is preferably less than 20, but may be 20 or more. Further, as shown in FIG. 14, as between the length L1 of the line segment that connects the origin and coordinates P1 representing the emission color of the first LED 301 and the length L2 of the line segment that connects the origin and coordinates P2 representing the emission color of the second LED 302, the ratio of one of them to the other and the ratio of the other to said one of them, are preferably at most 2.0, but may exceed 2.0.

In the example shown in FIG. 14, the emission color of the first LED 301 and the emission color of the second LED 302 are in such a relation that on the a*b* coordinate plane in the CIE (1976) L*a*b* color space chromaticity diagram, each of the length L1 of the line segment that connects the origin and coordinates T1 representing the emission color of the first LED 301 and the length L2 of the line segment that connects the origin and coordinates P2 representing the emission color of the second LED 302, is at least 5. By such a construction, the emission color of the first LED 301 and the emission color of the second LED 302 become colors different from a white light, and it becomes possible to certainly tell the change of the color of light emitted from the LED light emitting device 1 in the course of change from the emission color of the first LED 301 to the emission color of the second LED 302. Further, each of the length L1 of the line segment that connects the origin and coordinates P1 representing the emission color of the first LED 301 and the length L2 of the line segment that connects the origin and coordinates P2 representing the emission color of the second LED 302, is preferably from 5 to 30, more preferably from 10 to 30, further preferably from 20 to 30. Here, as shown in FIG. 14, each of the length L1 of the line segment that connects the origin and coordinates P1 representing the emission color of the first LED 301 and the length L2 of the line segment that connects the origin and coordinates P2 representing the emission color of the second LED 302, is preferably from 5 to 30, but may be less than 5 or may exceed 30.

Further, in the example shown in FIG. 14, it is so constructed that on the a*b* coordinate plane in the CIE (1976) L*a*b* color space chromaticity diagram, the coordinates P1 representing the emission color of the first LED 301 are within a range where the value of a* is smaller than −20 and the value of b* is smaller than 20, and the coordinates P2 representing the emission color of the second LED 302 is within a range where the value of a* is larger than 20 and the value of b* is larger than −20. By such a construction, from the first LED 301, a light with a color capable of giving an impression of "safe", "normal", "cold", "cool" or the like, is usually emitted, and from the second LED 302, a light with a color capable of giving an impression of "danger", "abnormal", "warm", "hot" or the like, is usually emitted. That is, the impression to be given by the light emitted from the first LED 301 may be made to be in contrast with the impression to be given by the light emitted from the second LED 302. Thus, the impression to be given to the observer of the light emitted from the LED light emitting device 1 can be changed to a contrasting impression. Further, as shown in FIG. 14, the coordinates P1 representing the emission color of the first LED 301 and the coordinates P2 representing the emission color of the second LED 302 are preferably within the above-mentioned ranges, but the coordinates P1 representing the emission color of the first LED 301 are more preferably within a range where the value of a* is smaller than −20 and the value of b* is smaller than 0, further preferably within a range where the value of a* is smaller than −30 and the value of b* is smaller than −20. Further, the coordinates P2 representing the emission color of the second LED 302 are more preferably within a range where the value of a* is larger than 20 and the value of b* is larger than 0, further preferably within a range where the value of a* is larger than 30 and the value of b* is larger than 20. Further, the coordinates P1 representing the emission color of the first LED 301 and the coordinates P2 representing the emission color of the second LED 302 may be outside the above-mentioned preferred ranges. By such a construction, it becomes possible to give various impressions other than the above-mentioned impressions, by the light emitted from the first LED 301 and the light emitted from the second LED 302.

The present invention is by no means limited to the above-described embodiment and modification examples and may be variously modified without departing from the concept of the present invention.

INDUSTRIAL APPLICABILITY

The LED light emitting device of the present invention is capable of realizing a distinct change of the emission color and presenting a highly distinguishable emission color also in an intermediate region within the changeable range of the emission color, and thus is useful as an indicator for electronic devices, vehicles, etc.

This application is a continuation of PCT Application No. PCT/JP2011/068395, filed on Aug. 11, 2011, which is based upon and claims the benefit of priority from Japanese Patent Application No. 2010-183138 filed on Aug. 18, 2010. The contents of those applications are incorporated herein by reference in its entirety.

REFERENCE SYMBOLS

1: LED light emitting device
10: Circuit board
11: First semiconductor light emitting element
12: Second semiconductor light emitting element
13: Reflector (wall member)
14: Partition member
15: First region
16: Second region
21: First phosphor member (first wavelength conversion member)
22: Second phosphor member (second wavelength conversion member)
23: First phosphor
25: Second phosphor
32: Drive controller section (drive controller unit)
40: Operation member
50, 150, 250: Indicator
100: Air conditioner (electronic device)
140: Temperature-setting dial (operation member)
301: First LED
302: Second LED
311: First semiconductor light emitting element
321: First phosphor member (first wavelength conversion member)
323: First phosphor

What is claimed is:

1. An LED light emitting device which radiates a combined light obtained by combining visible light emitted from first LED and visible light emitted from second LED, comprising: a drive controller unit that respectively controls a first drive current to be supplied to the first LED and a second drive current to be supplied to the second LED, wherein
the first LED emits visible light of an emission color such that with respect to a CIE (1976) L*u*v* color space chromaticity diagram, the chromaticity is exterior to a prescribed white light region wherein the absolute value of a deviation duv from a blackbody radiation locus is at most 0.02 and the color temperature is within a range of from 2,500 K to 10,000 K, and the deviation duv from the blackbody radiation locus is larger than 0.02, and
the second LED emits visible light of an emission color such that with respect to the CIE (1976) L*u*v* color space chromaticity diagram, the chromaticity is exterior to the prescribed white light region, and the deviation duv from the blackbody radiation locus is smaller than −0.02.

2. The LED light emitting device according to claim 1, wherein the drive controller unit controls the first and second drive currents so that the chromaticity of the combined light moves on a line that connects the chromaticity of the emission color of the first LED and the chromaticity of the emission color of the second LED.

3. The LED light emitting device according to claim 2, wherein the line that connects the chromaticity of the emission color of the first LED and the chromaticity of the emission color of the second LED, passes through a chromaticity point at which X is at least 0.32 and at most 0.34, and Y is at least 0.32 and at most 0.34, in the CIE (1931) XYZ color space.

4. The LED light emitting device according to claim 1, wherein the emission color of the first LED and the emission color of the second LED are in a complementary color relation to each other.

5. The LED light emitting device according to claim 1, wherein the emission color of the first LED and the emission color of the second LED are characterized in that on the a*b* coordinate plane in the CIE (1976) L*a*b* color space chromaticity diagram, the angle between a line segment that connects the origin and coordinates representing the emission color of the first LED and a line segment that connects the origin and coordinates representing the emission color of the second LED, is an angle of at least 120° and at most 240°.

6. The LED light emitting device according to claim 1, wherein the emission color of the first LED and the emission color of the second LED are characterized in that on the a*b* coordinate plane in the CIE (1976) L*a*b* color space chromaticity diagram, the difference between the length of a line segment that connects the origin and coordinates representing the emission color of the first LED and the length of a line segment that connects the origin and coordinates representing the emission color of the second LED, is less than 20.

7. The LED light emitting device according to claim 1, wherein the emission color of the first LED and the emission color of the second LED are characterized in that on the a*b* coordinate plane in the CIE (1976) L*a*b* color space chromaticity diagram, as between the length of a line segment that connects the origin and coordinates representing the emission color of the first LED and the length of a line segment that connects the origin and coordinates representing the emission color of the second LED, the ratio of one of them to the other and the ratio of the other to said one of them are at most 2.0.

8. The LED light emitting device according to claim 1, wherein the emission color of the first LED and the emission color of the second LED are characterized in that on the a*b* coordinate plane in the CIE (1976) L*a*b* color space chromaticity diagram, the length of a line segment that connects the origin and coordinates representing the emission color of the first LED and the length of a line segment that connects the origin and coordinates representing the emission color of the second LED, are, respectively, at least 5.

9. The LED light emitting device according to claim 1, wherein on the a*b* coordinate plane in the CIE (1976) L*a*b* color space chromaticity diagram, the coordinates representing the emission color of the first LED are characterized in that the value of a* is smaller than −20 and the value of b* is smaller than 20, and the coordinates representing the emission color of the second LED are characterized in that the value of a* is larger than 20 and the value of b* is larger than −20.

10. The LED light emitting device according to claim 1, wherein the first LED comprises a first semiconductor light emitting element to be driven by the first drive current to emit light, and a first wavelength conversion member to let a part or whole of the light emitted from the first semiconductor light emitting element undergo wavelength conversion and then radiate the light, and the second LED comprises a second semiconductor light emitting element to be driven by the second drive current to emit light, and a second wavelength conversion member to let a part or whole of the light emitted from the second semiconductor light emitting element undergo wavelength conversion and then radiate the light.

11. The LED light emitting device according to claim 10, wherein the first wavelength conversion member contains a first phosphor to convert the light emitted from the first semiconductor light emitting element to light having a longer wavelength by wavelength conversion and then radiate the light, and the second wavelength conversion member contains a second phosphor to convert the light emitted from the second semiconductor light emitting element to light having a longer wavelength by wavelength conversion and then radiate the light.

12. The LED light emitting device according to claim 10, which comprises
- a circuit board on which the first semiconductor light emitting element and the second semiconductor light emitting element are mounted,
- a wall member formed on the circuit board to surround the first semiconductor light emitting element and the second semiconductor light emitting element, and
- a partition member to divide a region inside of the wall member into a first region where the first semiconductor light emitting element is disposed and a second region where the second semiconductor light emitting element is disposed,
- wherein the first wavelength conversion member is accommodated in the first region, and the second wavelength conversion member is accommodated in the second region.

13. The LED light emitting device according to claim 12, wherein in the first region, one or a plurality of the first semiconductor light emitting elements are disposed, and in the second region, one or a plurality of the second semiconductor light emitting elements are disposed.

14. The LED light emitting device according to claim 10, which comprises
- a circuit board on which a plurality of the first semiconductor light emitting elements and a plurality of the second semiconductor light emitting elements are mounted,
- wherein the first wavelength conversion member is provided for each of the plurality of the first semiconductor light emitting elements, and the second wavelength conversion member is provided for each of the plurality of the second semiconductor light emitting elements.

15. The LED light emitting device according to claim 14, wherein the plurality of the first semiconductor light emitting elements and the plurality of the second semiconductor light emitting elements are disposed as dispersed on the circuit board so that they are mutually mixed with each other.

16. The LED light emitting device according to claim 10, wherein the first semiconductor light emitting element and the second semiconductor light emitting element emit light having a peak wavelength in a wavelength range of from 360 nm to 420 nm.

17. An indicator employing the light radiated from the LED device as defined in claim 1 to carry out an indication depending on the degree of a physical quantity that is changeable at least over a preliminarily estimated changeable range, which comprises an indication controller unit to control the drive controller unit so that in response to a change of the physical quantity from the lower limit value to the upper limit value within the changeable range, the first drive current is decreased from a prescribed first upper limit current value to a prescribed first lower limit current value, and at the same time, the second drive current is increased from a prescribed second lower limit current value to a prescribed second upper limit current value.

18. The indicator according to claim 17, which is provided on an electronic device, wherein the physical quantity is a preset value that is set by an operation member provided to carry out setting of the electronic device.

19. The indicator according to claim 17, which is mounted on a vehicle, wherein the physical quantity is an operating condition quantity that changes in accordance with the operating condition of the vehicle.

* * * * *